(12) United States Patent
Weyers et al.

(10) Patent No.: US 11,302,781 B2
(45) Date of Patent: Apr. 12, 2022

(54) SEMICONDUCTOR DEVICE HAVING AN ELECTROSTATIC DISCHARGE PROTECTION STRUCTURE

(71) Applicant: Infineon Technologies AG, Neubiberg (DE)

(72) Inventors: Joachim Weyers, Hoehenkirchen (DE); Stefan Gamerith, Villach (AT); Franz Hirler, Isen (DE); Anton Mauder, Kolbermoor (DE)

(73) Assignee: Infineon Technologies AG, Neubiberg (DE)

( * ) Notice: Subject to any disclaimer, the term of this patent is extended or adjusted under 35 U.S.C. 154(b) by 369 days.

(21) Appl. No.: 15/951,918

(22) Filed: Apr. 12, 2018

(65) Prior Publication Data
US 2018/0301537 A1 Oct. 18, 2018

(30) Foreign Application Priority Data
Apr. 13, 2017 (DE) .......................... 102017108047.3

(51) Int. Cl.
*H01L 29/16* (2006.01)
*H01L 27/02* (2006.01)
*H01L 29/06* (2006.01)

(52) U.S. Cl.
CPC ...... *H01L 29/1608* (2013.01); *H01L 27/0255* (2013.01); *H01L 27/0262* (2013.01); *H01L 29/0649* (2013.01)

(58) Field of Classification Search
CPC ............. H01L 29/1608; H01L 27/0262; H01L 27/0255; H01L 29/0649

USPC ............................................ 257/77, 49, 506
See application file for complete search history.

(56) References Cited

U.S. PATENT DOCUMENTS

| | | | |
|---|---|---|---|
| 6,320,205 B1 | 11/2001 | Pfirsch et al. | |
| 7,511,357 B2 | 3/2009 | Hshieh | |
| 7,952,137 B2 | 5/2011 | Lin et al. | |
| 8,004,009 B2 | 8/2011 | Hsieh | |
| 2002/0050602 A1 | 5/2002 | Narazaki | |
| 2015/0041816 A1 | 2/2015 | Wood et al. | |
| 2015/0243561 A1* | 8/2015 | Schmenn | H01L 21/76224 257/506 |
| 2015/0294966 A1* | 10/2015 | Weyers | H01L 29/861 257/49 |

FOREIGN PATENT DOCUMENTS

| | | |
|---|---|---|
| DE | 102013108518 A1 | 2/2015 |
| DE | 102015105638 A1 | 10/2015 |

* cited by examiner

*Primary Examiner* — Bo Fan
(74) *Attorney, Agent, or Firm* — Murphy, Bilak & Homiller, PLLC

(57) ABSTRACT

A semiconductor device includes a semiconductor body having a first surface and a second surface opposite to the first surface. A transistor structure is formed is the semiconductor body. A trench structure extends from the first surface into the semiconductor body. An electrostatic discharge protection structure is accommodated in the trench structure. The electrostatic discharge protection structure includes a first terminal region and a second terminal region. A source contact structure at the first surface is electrically connected to source regions of the transistor structure and to the first terminal region. A gate contact structure at the first surface is electrically connected to a gate electrode of the transistor structure and to the second terminal region.

20 Claims, 13 Drawing Sheets

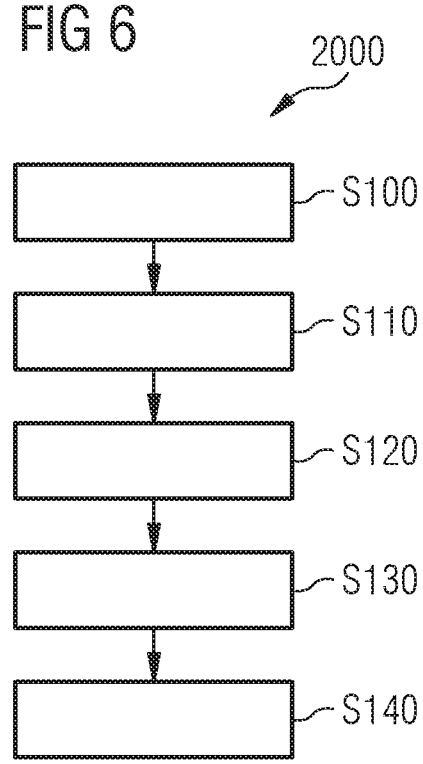

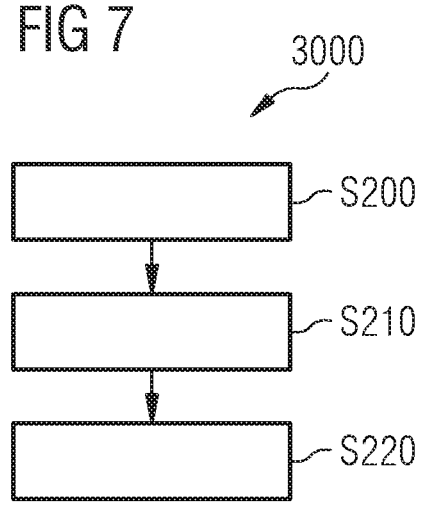
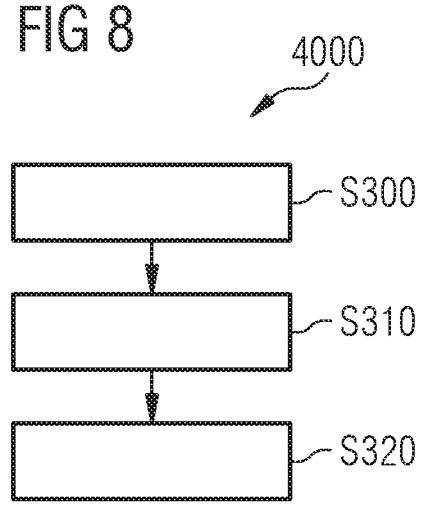

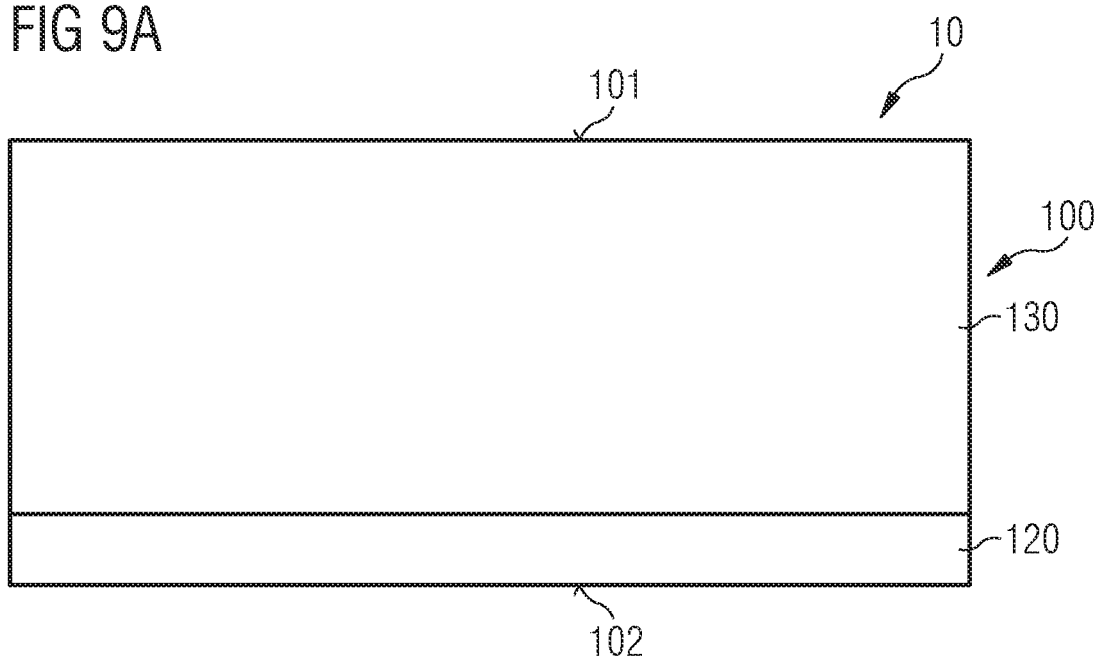
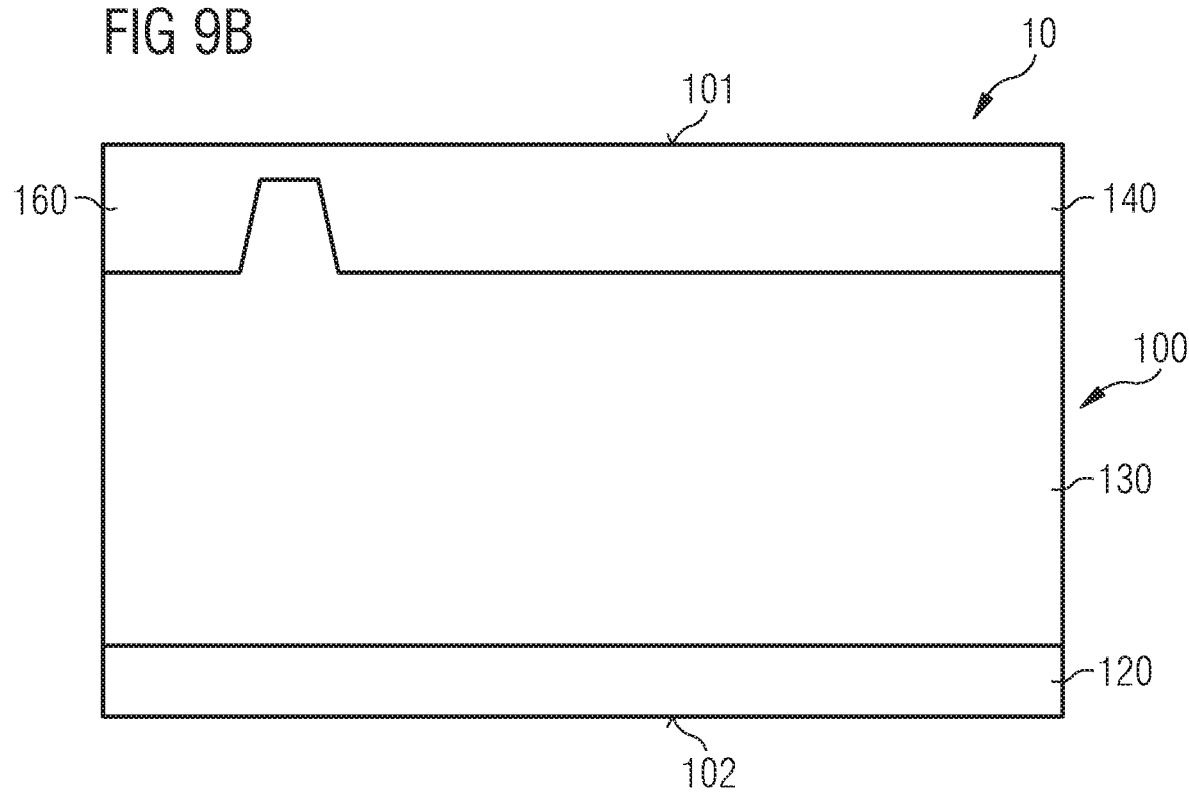

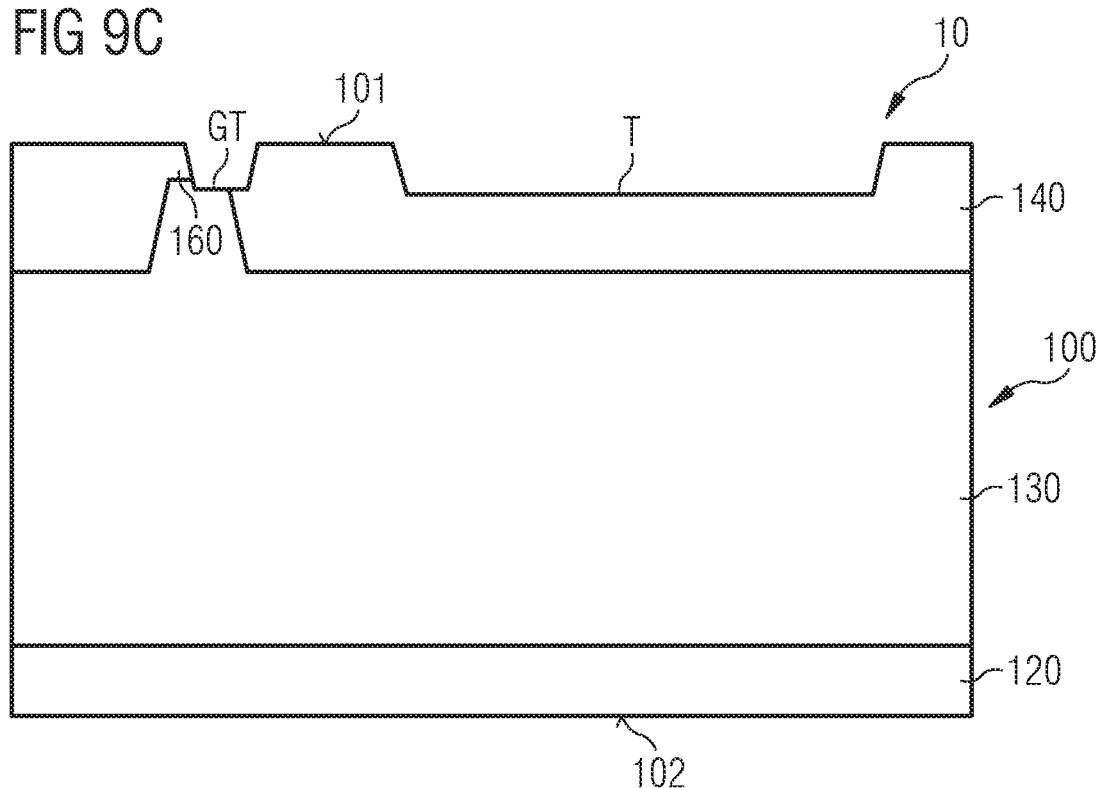
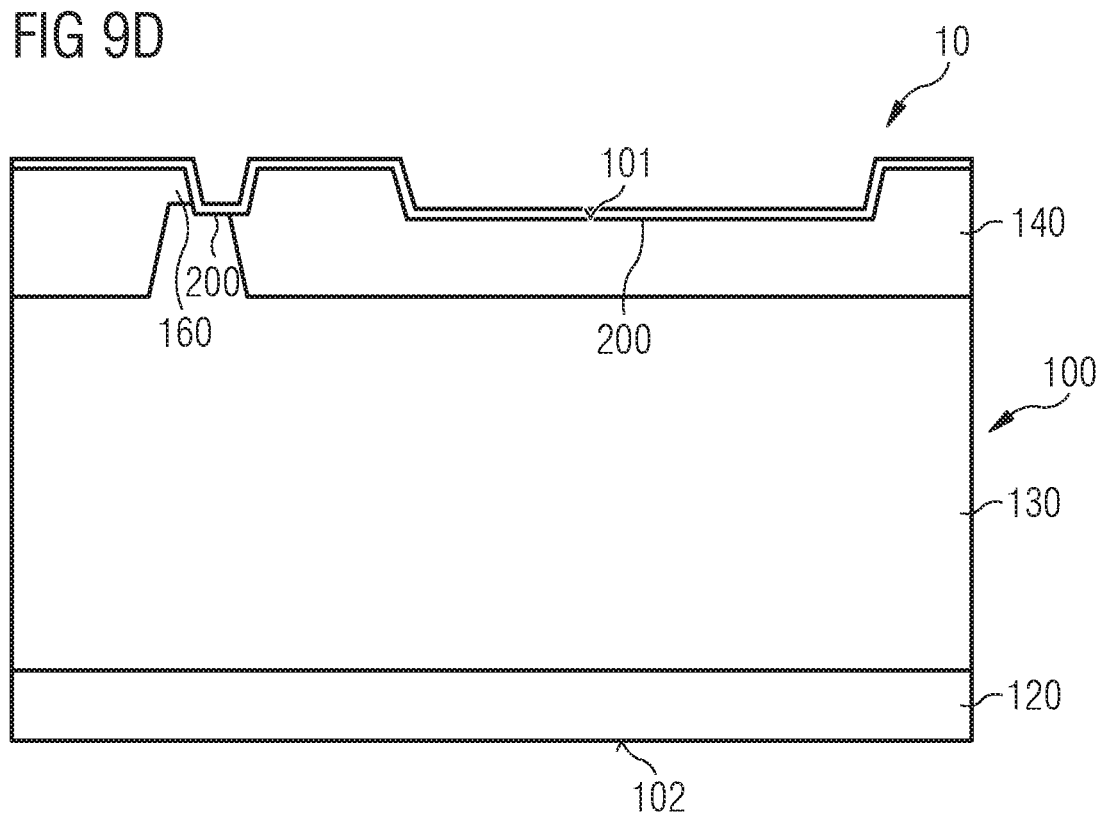

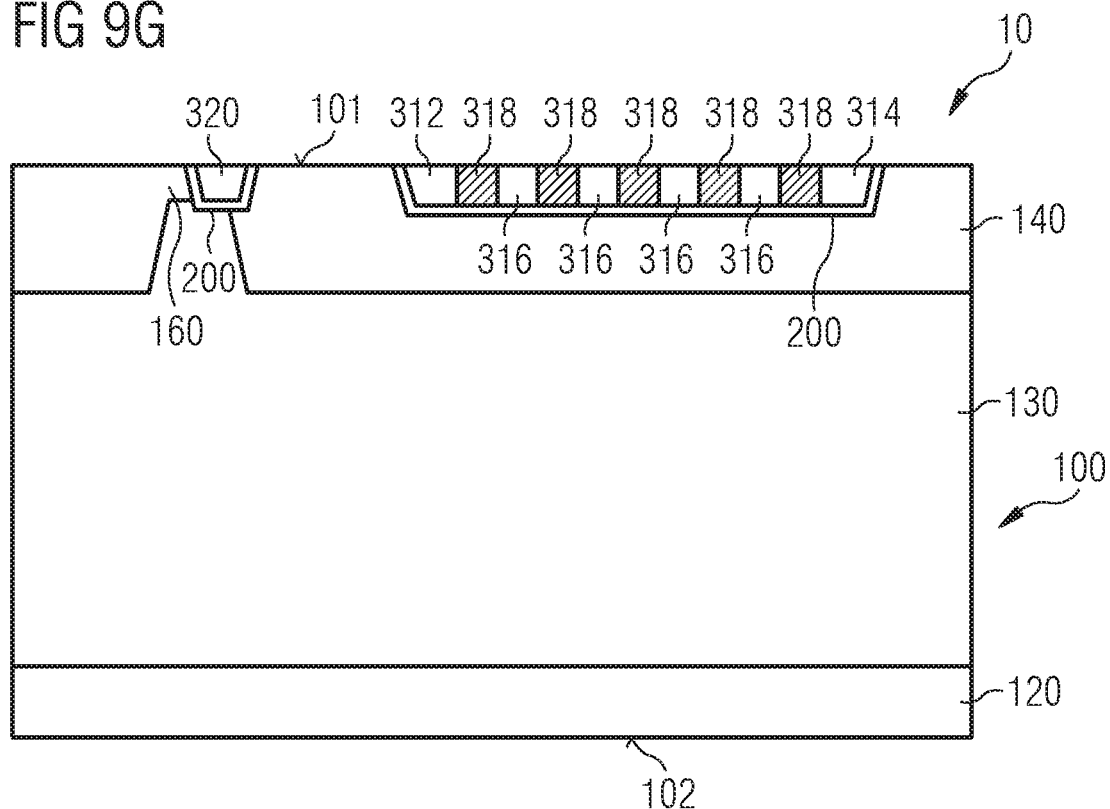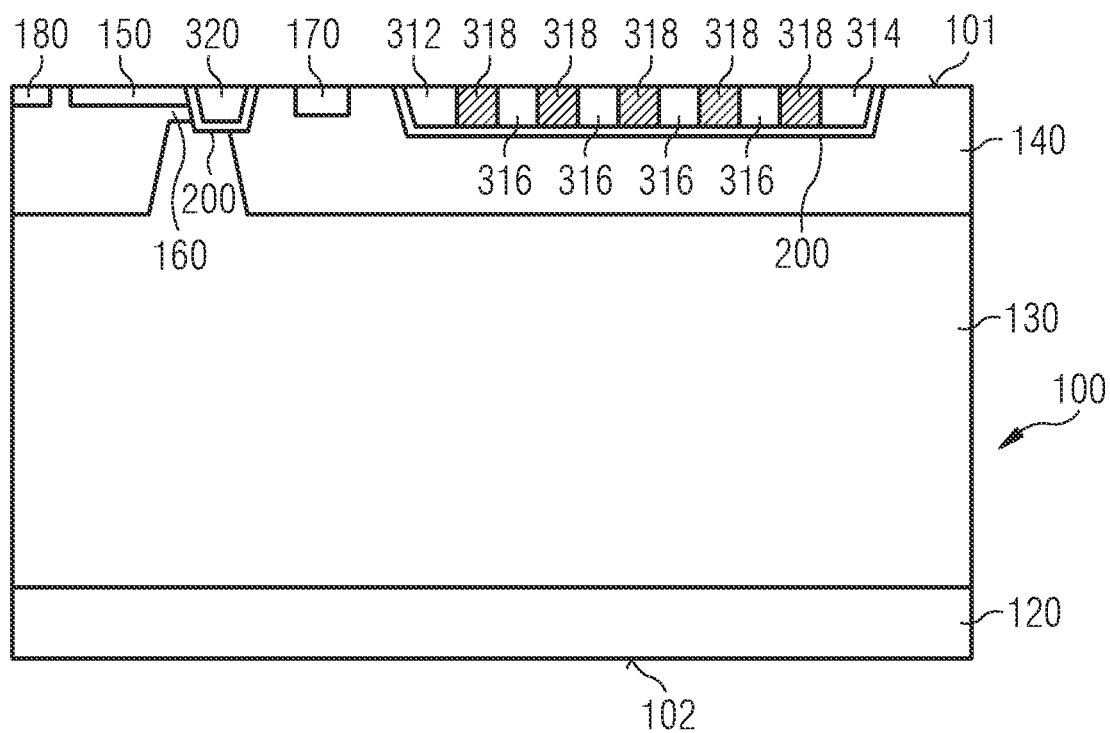

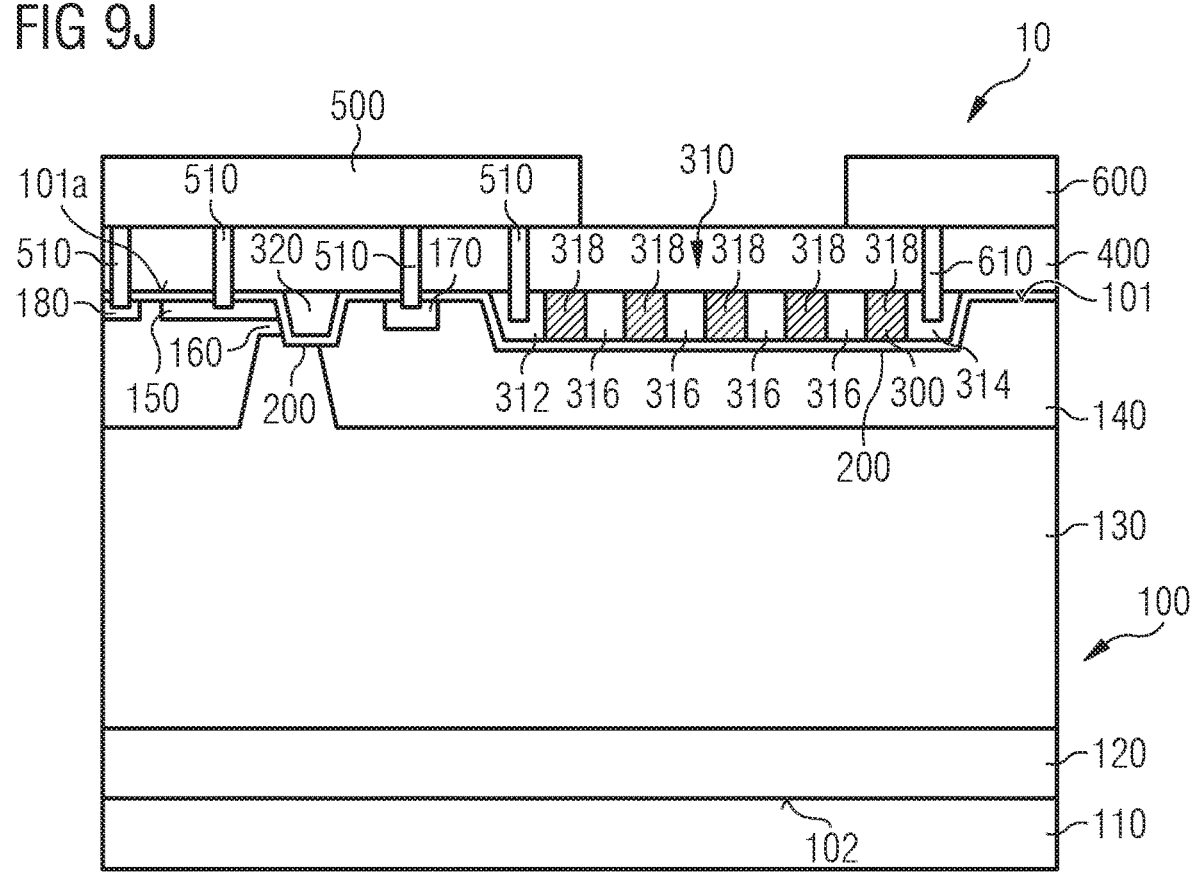

SEMICONDUCTOR DEVICE HAVING AN ELECTROSTATIC DISCHARGE PROTECTION STRUCTURE

BACKGROUND

A key component in semiconductor applications is a solid-state switch. As an example, switches turn loads of automotive applications or industrial applications on and off. Solid-state switches typically for example, field effect transistors (FETs) such as metal-oxide-semiconductor FETs (MOSFETs) or insulated gate bipolar transistors (IGBTs).

In these applications, a damage of a gate dielectric between gate and source of the transistors may be caused by an electrostatic discharge event between a gate contact area and a source contact area of the semiconductor device. To protect the gate dielectric from an electrostatic discharge event, electrostatic discharge (ESD) protection structures are provided, which protect the transistors from electrostatic discharge during assembly or operation, for example. These ESD protection structures require non-negligible area within the integrated semiconductor device.

It is further beneficial to increase the thermoelectric safe operating area of an ESD structure to achieve a predetermined electrostatic discharge robustness while having at the same time a reduced area consumption of the ESD protection structure.

It is thus desirable to provide a semiconductor device structure with enhanced ESD protection and thermal characteristics, having at the same time an optimized area efficiency and less topology.

SUMMARY

The present disclosure relates to a semiconductor device comprising a semiconductor body. The semiconductor body has a first surface and a second surface opposite to the first surface. A transistor structure is formed in the semiconductor body. A trench structure extends from the first surface into the semiconductor body. An electrostatic discharge protection structure is accommodated in the trench structure. The electrostatic discharge protection structure comprises a first terminal and a second terminal. A source contact structure at the first surface is electrically connected to source regions of the transistor structure and to the first terminal. A gate contact structure at the first surface is electrically connected to a gate electrode of the transistor structure and to the second terminal.

The present disclosure also relates to a semiconductor device comprising a silicon carbide semiconductor body. The silicon carbide semiconductor body has a first surface and a second surface opposite to the first surface. A transistor structure is formed in the silicon carbide semiconductor body. An electrostatic discharge protection structure is on the silicon carbide semiconductor body. The electrostatic discharge protection structure comprises a first terminal and a second terminal. A source contact structure at the first surface is electrically connected to source regions of the transistor structure and to the first terminal. A gate contact structure at the first surface is electrically connected to a gate electrode of the transistor structure and to the second terminal.

The present disclosure further relates to a method of manufacturing a semiconductor device, the method comprises forming a transistor structure in a semiconductor body. The semiconductor body has a first surface and a second surface opposite to the first surface. Further, a trench structure is formed, which extends from the first surface into the semiconductor body. In addition, an electrostatic discharge protection structure is formed, which is accommodated in the trench structure. The electrostatic discharge protection structure comprises a first terminal and a second terminal. The method further comprises forming a source contact structure at the first surface. The source contact structure is electrically connected to source regions of the transistor structure and to the first terminal. Furthermore, a gate contact structure is formed at the first surface. The gate contact structure is electrically connected to a gate electrode of the transistor structure and to the second terminal.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 6 illustrates a schematic process chart of a method of manufacturing a semiconductor device in accordance with an embodiment.

FIG. 7 illustrates a schematic process chart of a method of manufacturing a semiconductor device in accordance with an embodiment.

FIG. 8 illustrates a schematic process chart of a method of manufacturing a semiconductor device in accordance with an embodiment.

FIGS. 9A to 9J are cross-sectional views illustrating a method of manufacturing a semiconductor device in accordance with an embodiment.

DETAILED DESCRIPTION

Figure 1:
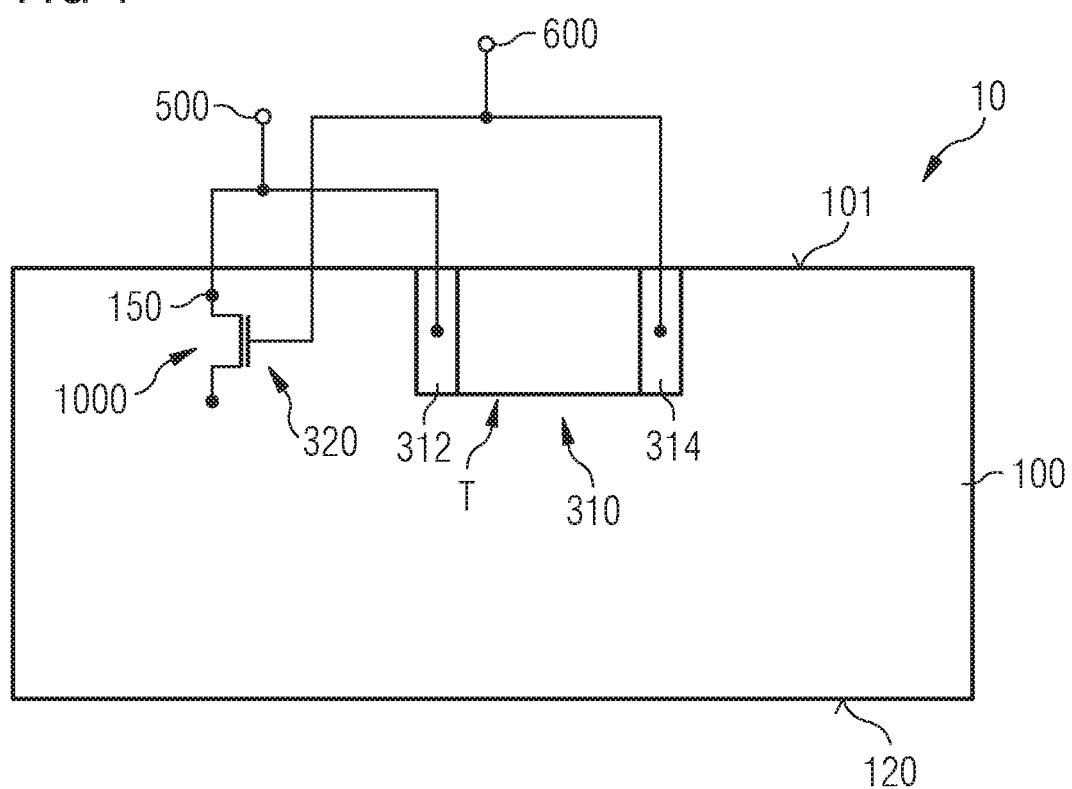
FIG. 1 is a schematic cross-sectional view of a portion of a semiconductor device in accordance with an embodiment.

In the following detailed description, reference is made to the accompanying drawings, which form a part hereof, and in which are shown by way of illustrations specific embodiments. It is to be understood that other embodiments may be utilized and structural and logical changes may be made without departing from the scope of the present invention. For example features illustrated or described for one embodiment may be used on or in conjunction with other embodiments to yield yet a further embodiment. It is intended that the present invention include such modifications and variations. The examples are described using specific language, which should not be construed as limiting the scope of the appending claims. The drawings are not scaled and for illustrative purpose only. For clarity, corresponding elements have been designated by the same references in the different drawings if not stated otherwise.

The terms "having", "containing", "including", "comprising" and the like are open and the terms indicate the presence of stated structures, elements or features but not preclude additional elements or features.

The terms "one after another", "successively" and the like indicate a loose ordering of elements not precluding additional elements placed in between the ordered elements.

The articles "a", "an", and "the" are intended to include the plural as well as the singular, unless the context clearly indicates otherwise.

In this specification, n-type or n-doped may refer to a first conductivity type while p-type or p-doped is referred to a second conductivity type. Semiconductor devices may be formed with opposite doping relations so that the first conductivity type may be p-doped and the second conductivity type may be n-doped. Furthermore, some figures illustrate relative doping concentrations by indicating "−" or "+" next to the doping type. For example, "n$^-$" means a doping concentration less than the doping concentration of an "n"-doping region while an "n$^+$"-doping region has a larger doping concentration than the "n"-doping region. Indicating the relative doping concentration does not, however, mean that doping regions of the same relative doping concentration have the same absolute doping concentration unless otherwise stated. For example, two different n$^+$ regions may have different absolute doping concentrations. The same applies, for example, to an n$^+$ and a p$^+$ region.

The first conductivity type may be n- or p-type provided that the second conductivity type is complementary.

The term "electrically connected" describes a permanent low-ohmic connection between electrically connected elements, for example a direct contact between the concerned elements or a low-ohmic connection via a metal and/or highly doped semiconductor.

The terms "wafer", "substrate", "semiconductor body" or "semiconductor substrate" used in the following description may include any semiconductor-based structure that has a semiconductor surface. Wafer and structure are to be understood to include silicon (Si), silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon germanium (SiGe), germanium (Ge) or gallium arsenide (GaAs). According to other embodiments, silicon carbide (SiC) or gallium nitride (GaN) may form the semiconductor substrate material.

The term "lateral" as used in this specification intends to describe an orientation substantially parallel to a first or main surface of a semiconductor substrate or body. This may be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

Processing of a semiconductor wafer may result in semiconductor devices having terminal contacts such as contact pads (or electrodes) which allow electrical contact to be made with the integrated circuits or discrete semiconductor devices included in the semiconductor body. The electrodes may include one or more electrode metal layers which are applied to the semiconductor material of the semiconductor chips. The electrode metal layers may be manufactured with any desired geometric shape and any desired material composition. The electrode metal layers may, for example, be in the form of a layer covering an area. Any desired metal, for example Cu, Ni, Al, Sn, Au, Ag, Pt, Pd, and an alloy of one or more of these metals may be used as the material. The electrode metal layer(s) need not be homogenous or manufactured from just one material, that is to say various compositions and concentrations of the materials contained in the electrode metal layer(s) are possible. As an example, the electrode layers may be dimensioned large enough to be bonded with a wire.

In embodiments disclosed herein one or more conductive layers, for example electrically conductive layers, are applied. It should be appreciated that any such terms as "formed" or "applied" are meant to cover literally all kinds and techniques of applying layers. In particular, they are meant to cover techniques in which layers are applied at once as a whole such as, for example, laminating techniques as well as techniques in which layers are deposited in a sequential manner such as, for example, sputtering, plating, molding, CVD (Chemical Vapor Deposition), physical vapor deposition (PVD), evaporation, hybrid physical-chemical vapor deposition (HPCVD), etc.

The applied conductive layer may comprise, inter alia, one or more of a layer of metal such as Cu or Sn or an alloy thereof, a layer of a conductive paste and a layer of a bond material. The layer of a metal may be a homogeneous layer. The conductive paste may include metal particles distributed in a vaporizable or curable polymer material, wherein the paste may be fluid, viscous or waxy. The bond material may be applied to electrically and mechanically connect the semiconductor chip, e.g., to a carrier or, e.g., to a contact clip. A soft solder material or, in particular, a solder material capable of forming diffusion solder bonds may be used, for example solder material comprising one or more of Sn, SnAg, SnAu, SnCu, In, InAg, InCu and InAu.

A dicing process may be used to divide the semiconductor wafer into individual chips. Any technique for dicing may be applied, e.g., blade dicing (sawing), laser dicing, etching, etc. The semiconductor body, for example a semiconductor wafer may be diced by applying the semiconductor wafer on a tape, in particular a dicing tape, apply the dicing pattern, in particular a rectangular pattern, to the semiconductor wafer, e.g., according to one or more of the above mentioned techniques, and pull the tape, e.g., along four orthogonal directions in the plane of the tape. By pulling the tape, the semiconductor wafer gets divided into a plurality of semiconductor dies (chips).

It is to be understood that the features of the various embodiments described herein may be combined with each other, unless specifically noted otherwise.

FIG. 1 is a schematic cross-sectional view of a portion of a semiconductor device 10 in accordance with an embodiment. The semiconductor device 10 comprises a semiconductor body 100 having a first surface 101 and a second surface 102 opposite to the first surface 101. The semiconductor device 10 further comprises a transistor structure 1000 in the semiconductor body 100. A trench structure T extends from the first surface 101 into the semiconductor body. An electrostatic discharge protection structure 310 is accommodated in the trench structure T, wherein the electrostatic discharge protection structure 310 comprises a first terminal region 312 and a second terminal region 314.

Furthermore, a source contact structure 500 is at the first surface 101, wherein the source contact structure 500 is electrically connected to source regions 150 of the transistor structure 1000 and to the first terminal region 312 of the electrostatic discharge protection structure 310. A gate contact structure 600 is also at the first surface 101, wherein the gate contact structure 600 is electrically connected to a gate electrode 320 of the transistor structure 1000 and to the second terminal region 314 of the electrostatic discharge protection structure 310.

By providing an electrostatic discharge protection structure 310 accommodated in the trench structure T, the further structure on the first surface 101 such as the source contact structure 500 and the gate contact structure 600 may be formed on a planar surface of the first surface 101. Thus, the semiconductor device 10 allows for less surface topology and a lower thermal impedance of the electrostatic discharge protection structure 310 being embedded in the semiconductor body 100.

Figure 2A:
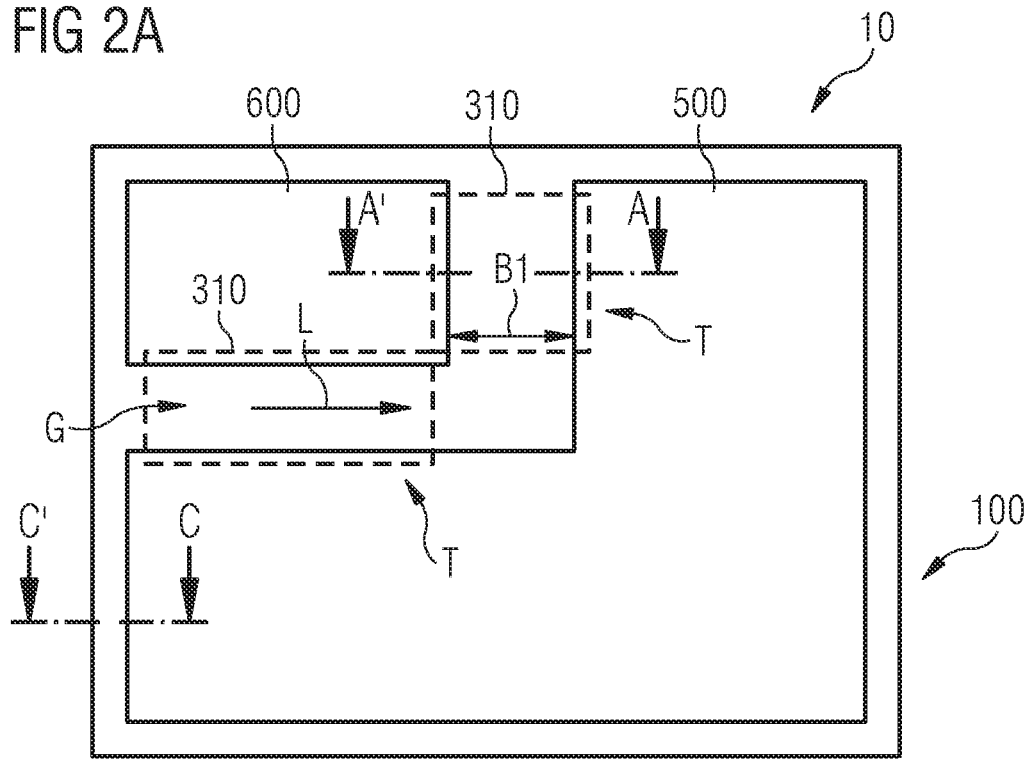
FIGS. 2A and 2B are schematic plan views of a portion of a semiconductor device in accordance with different embodiments.
Figure 2B:
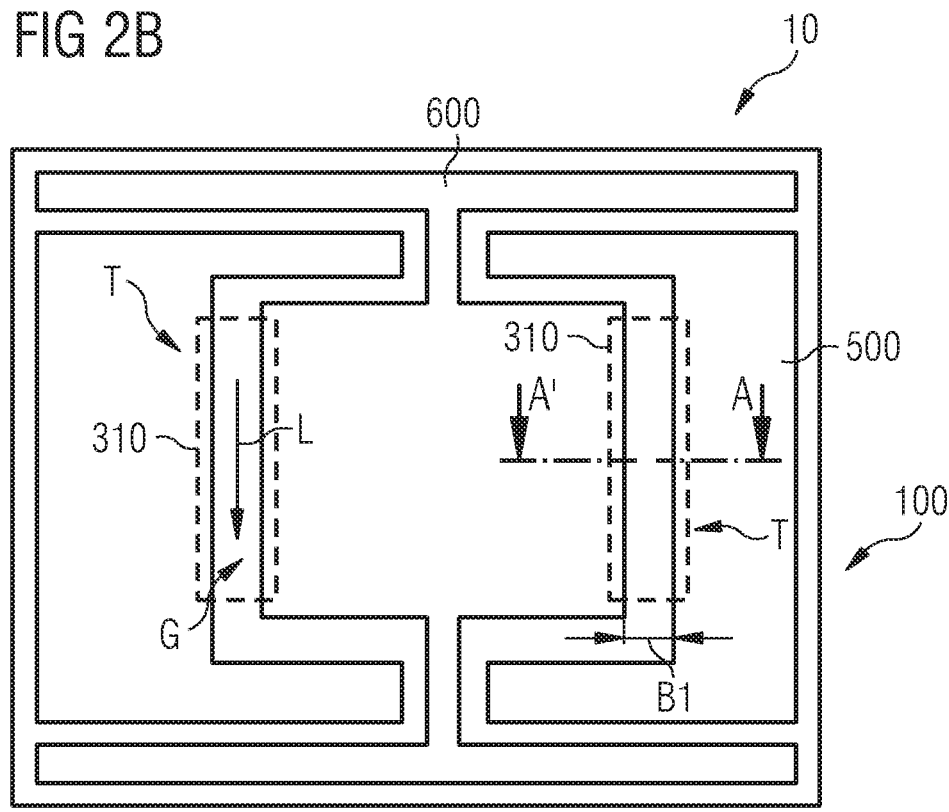

FIGS. 2A and 2B are schematic plan views of portions of a semiconductor device 10 in accordance with different embodiments. As depicted in FIG. 2A, the gate contact structure 600 is in a corner portion of the semiconductor device 10 and may act as a gate pad. The gate pad may be used for providing a bonding or soldering contact to be connected to an external device or element. The source contact structure 500 is arranged next to the gate contact structure 600 and may act as a source pad. The source pad may also be used for providing a bonding or a soldering contact to an external device or element.

When forming the semiconductor device 10 as a power semiconductor element, a resulting thickness of the metallization of the source contact structure 500 and the gate contact structure 600 may be in a range from 1 µm to 10 µm or from 3 µm to 7 µm, and the source contact structure 500 and the gate contact structure 600 may be separated by a minimum distance B1 in a range from 5 µm to 20 µm or from 10 µm to 15 µm. When applying anisotropic etching processes, the distance may be in the range from 2 µm to 5 µm. As can be seen from FIG. 2B, the gate contact structure 600 may be also arranged in a middle part of the semiconductor device 10, wherein the source contact structure 500 surrounds the gate contact structure 600. Possible locations of the trench structure T and the respective electrostatic discharge protection structure 310 accommodated in the trench structure T are indicated by dashed lines, wherein the indicated places are only exemplary and should not be understood as limiting.

In the plan view of FIGS. 2A and 2B, a lateral gap G extends between an edge portion of the source contact structure 500 and an edge portion of the gate contact structure 600. The normal to the first and second surfaces 101, 102 defines a vertical direction and directions orthogonal to the normal direction are lateral directions within a lateral plane. The lateral gap G may be a longitudinal gap extending along a length direction L, wherein the length direction L of the lateral gap G is to be understood as a direction parallel to a straight line, which does not cross parts of the source contact structure 500 and/or the gate contact structure 600 in a lateral plane. In other words, the lateral gap G has a bigger extension in a lateral plane parallel to edge portions of the source contact structure 500 and the gate contact structure 600 in comparison to its extension along a direction orthogonal to or facing the edge portions of the source contact structure 500 and the gate contact structure 600. It shall be also noted that the length direction L depends on the location within the lateral gap G and is not to be understood as a single direction.

The semiconductor device 10 may comprise power semiconductor elements such as IGBTs (insulated gate bipolar transistors), e.g. RC-IGBTs (reverse-conducting IGBTs), RB-IGBT (reverse-blocking IGBTs), and IGFETs (insulated gate field effect transistors) including MOSFETs (metal oxide semiconductor field effect transistors). The semiconductor device 10 may also comprise a superjunction transistor, a trench field effect transistor, or any further transistor device controlling a load current via a gate terminal.

Figure 3A:
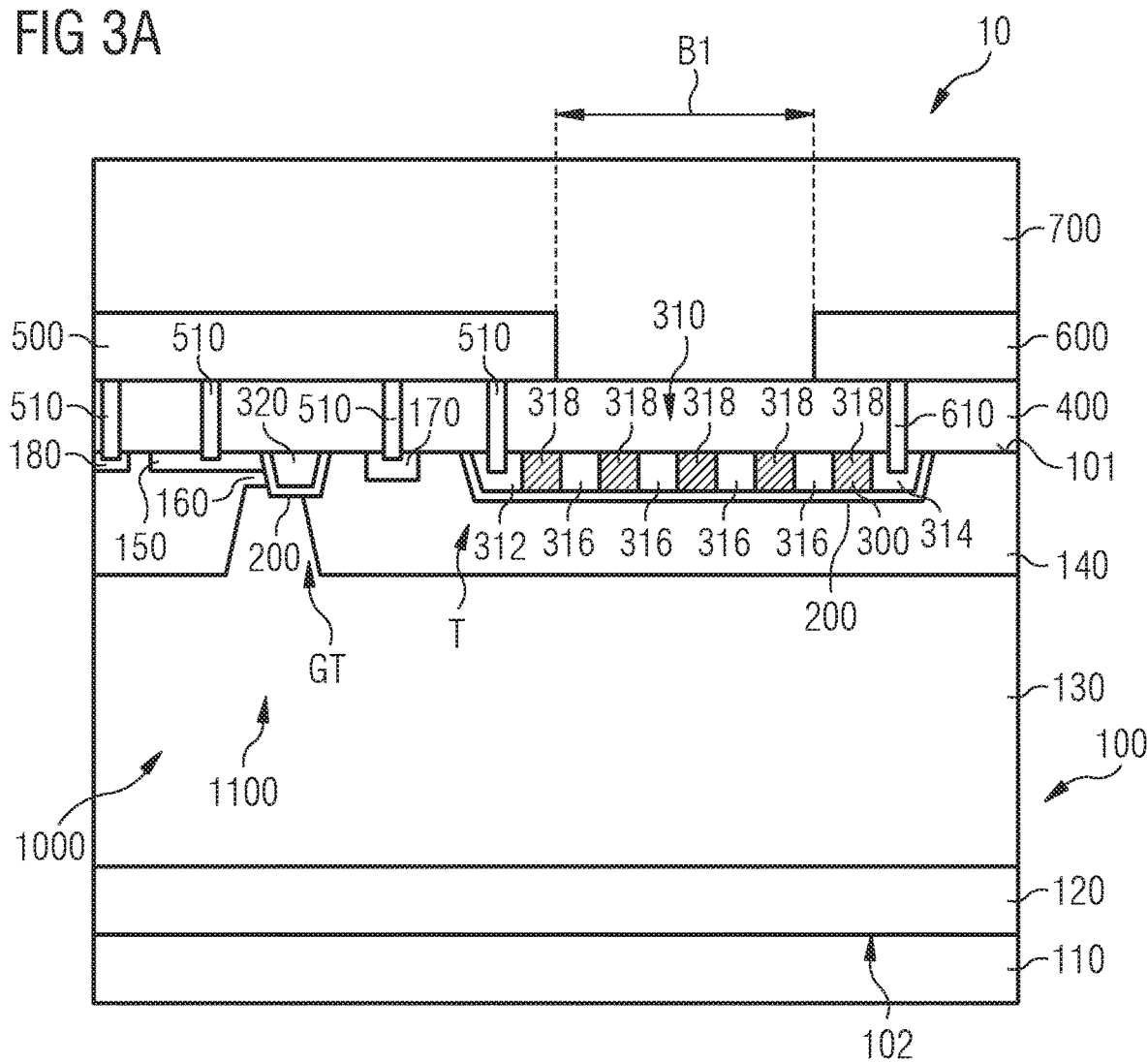
FIG. 3A is a schematic cross-sectional view of a portion of a semiconductor device taken along a sectional plane A-A' of FIG. 2A or FIG. 2B in accordance with an embodiment.

FIG. 3A is a schematic cross-sectional view of a portion of a semiconductor device 10 taken along a section plane A-A' of FIG. 2A or FIG. 2B in accordance with an embodiment.

The semiconductor body 100 may be provided from a single-crystalline semiconductor material, for example silicon Si, silicon carbide SiC, germanium Ge, a silicon germanium crystal SiGe, nitride GaN or gallium arsenide GaAs. A distance between the first and second surfaces 101, 102 is selected to achieve a specified voltage blocking capability and may be at least 2 µm, or at least 5 µm, or at least 20 µm, or at least 50 µm, for example. Other embodiments may provide a semiconductor body 100 with a thickness of several 100 µm. The semiconductor body 100 may have a rectangular shape with an edge length in the range from 500 µm up to several millimeters, for example.

Referring to FIG. 3A, the trench structure T extends into the semiconductor body 100 from the first surface 101. Within the trench structure T, the electrostatic discharge protection structure 310 is accommodated. The electrostatic discharge protection structure 310 comprises the first terminal region 312 and the second terminal region 314 to be electrically connected to the source contact structure 500 and the gate contact structure 600, respectively. The electrostatic discharge protection structure 310 may comprise a polycrystalline silicon layer 300 having first regions 316 and at least one second region 318 of opposite conductivity type alternatively arranged to constitute a back-to-back diode chain. Thus, the electrostatic discharge protection structure 310 may include at least one polysilicon diode having the first and second regions 316, 318 connected in series.

It is particularly possible for the electrostatic discharge protection structure 310 to include a plurality of first regions 316 and a plurality of second regions 318 of opposite conductivity type, wherein the first and second regions 316, 318 are positioned in a single trench structure T.

Herein, the resulting diode may be bidirectional, having an odd number of first or second regions 316, 318, e.g. a n-p-n- . . . -p-n structure. The resulting diode may also be bidirectional unsymmetrical, having an even number of first and second regions 316, 318, e.g. a n-p-n- . . . -p structure.

In detail, the electrostatic discharge protection structure 310 may be manufactured by forming the polycrystalline silicon layer 300 of a first conductivity type within the trench structure T. After forming the polycrystalline silicon layer 300, a mask layer (not shown), e.g. a hard mask layer or a resist layer is formed on the polycrystalline silicon layer 300 and is patterned by a lithographic process, such that the second regions 318 are not covered by the mask layer. In a subsequent implantation process, dopants of a second conductivity type are introduced into the exposed second regions 318 not covered by the mask layer on the polycrystalline silicon layer 300, to form the second regions 318 of the second conductivity type. Thus, each of the first regions 316 and second regions 318 comprises first dopants of the first conductivity type, and the second regions 318 further comprise second dopants of the second conductivity type overcompensating the first dopants of the first conductivity type. In another embodiment, each of the first regions 316 may comprise first dopants of the first conductivity type and the second regions 318 may comprise second dopants of the second conductivity type only, without overcompensating the first dopants of the first conductivity type. Herein, the first dopants are introduced into the first regions 316 and the second dopants are introduced into the second regions 318, respectively, in a separate process, e.g. by ion implantation and/or diffusion, wherein overlapping regions between the first and second regions 316, 318 may comprise first and second dopants due to diffusion of the dopants.

As a result, a polysilicon diode chain or string arranged in a lateral direction having alternating pn-junctions (diodes) at the region boundaries of the first and second regions 316, 318 in the polycrystalline silicon layer 300 is formed. In an embodiment, the doping concentrations of the first and second regions 316, 318 are configured such that a series connections of Zener diodes are formed within the polycrystalline silicon layer 300. By the number of consecutive diodes each including a first region 316 and a second region 318, the breakdown voltage of the electrostatic discharge protection structure 310 may be adjusted. The electrostatic discharge protection structure 310 may thus comprise a polycrystalline silicon layer 300 having first regions 316 and at least one second 318 of opposite conductivity type alternatively arranged to constitute a back-to-back-Zener diode chain.

As will be discussed with regard to the method of manufacturing the semiconductor device 10 below, the trench structure T is filled with polycrystalline silicon, wherein the polycrystalline silicon has a planar top side being parallel or flush with the first surface 101 of the semiconductor body 100. Thus, the further structure of the semiconductor device 10 on the first surface 101 may be formed on a planar surface, thus reducing the topology of the semiconductor device 10.

In order to electrically insulate the electrostatic discharge protection structure 310 or the polycrystalline silicon in the trench structure T from the semiconductor body 100, a dielectric layer 200 is formed to line a sidewall of the trench structure T. The dielectric layer 200 may include one or any combination of an oxide, nitride and, oxyitride, high-k material, an imide, an insulating resin or glass, for example. The dielectric layer 200 may include a field oxide formed e.g. by thermal oxidation or deposition or by a local oxidation of silicon (LOCOS) process or a gate oxide.

The electrostatic discharge protection structure 310 may further be covered on its planar top side being parallel or flush with the first surface 101 of the semiconductor body 100 by an isolation layer 400 formed on the first surface 101 of the semiconductor body 100.

The isolation layer 400 may be a single dielectric layer or may comprise a stack of dielectric layers. Herein, a first dielectric layer of the isolation layer 400 may include a tetraethylorthosilicate (TEOS)/undoped silicate glass (USG) film. The thickness of the first dielectric layer of the isolation layer 400 may be in a range from 50 nm to 500 nm. A second dielectric layer of the isolation layer 400 may include a phosphosilicate glass (PSG) or a borophosphosilicate glass (BPSG). The thickness of the second dielectric layer of the isolation layer 400 may be in a range from 200 nm to 2 μm.

The source contact structure 500 may be formed on the isolation layer 400. The gate contact structure 600 may be formed on the isolation layer 400, which is spaced apart from a part of the source contact structure 500 by the lateral gap. On the source contact structure 500 and the gate contact structure 600, a further passivation layer 700 may be formed, which may include one or any combination of an imide, a nitride, an oxide or an oxynitride, for example.

Referring to FIG. 3A, the source contact structure 500 may be electrically coupled to the first terminal region 312 of the electrostatic discharge protection structure 310 via a first electric contact structure 510, wherein the gate contact structure 600 may be electrically coupled to the second terminal region 314 of the electrostatic discharge protection structure 310 via a second contact structure 610. The first and second electric contact structures 510 and 610 may extend along a vertical direction through the isolation layer 400. As can be further seen from FIG. 3A, the first electric contact structure 510 may be provided to interconnect the source contact structure 500 with the source regions 150 of the transistor structure 1000.

The first and second electric contact structures 510, 610 are depicted in FIG. 3A as vias extending through the isolation layer 400 along a vertical direction, wherein the dimension along the vertical direction may be larger than the dimension along a lateral direction. In this case, the first and second electric contact structures 510, 610 may be formed separately to the source contact structure 500 and the gate contact structure 600, by depositing different metal layers for forming the metal vias and for forming the source and drain contact structure 500, 600. In case the isolation layer 400 has a dimension along the vertical direction being comparable to that of the openings for contacting the source contact structure 500 and the gate contact structure 600 with the structures in the semiconductor body 100, the first and second electric contact structure 510, 610 may also be formed simultaneously with the source contact structure 500 and the gate contact structure 600, respectively, to form a planar contact structure.

The gate contact structure 600 may comprise a metal. In addition, the source contact structure 500 may comprise a metal. The source contact structure 500 and the gate contact structure 600 may be patterned parts of a same conductive material layer on a same wiring level. The gate contact structure 600 and the source contact structure 500 may be separate parts, e.g. due to lithographic patterning, of a common metal wiring layer or stacked layer. The gate contact structure 600 and the source contact structure 500 may be formed as a metal layer structure including the first and second electric contact structures 510 and 610, respectively. Such a metal layer structure may consist of or contain, as main constituent(s), aluminum Al, copper Cu or alloys of aluminum or copper, for example AlSi, AlCu, or AlSiCu. According to other embodiments, the gate contact structure 600 and the source contact structure 500 may contain one, two, three or more sub-layers, each sub-layer including, as a main constituent, at least one of nickel Ni, titanium Ti, silver Ag, gold Au, tungsten W, platinum Pt and palladium Pd. For example, a sub-layer may contain a metal nitride or a metal alloy including Ni, Ti, Ag, Au, W, Pt, Pd and/or Co.

Referring to FIG. 3A, next to the electrostatic discharge protection structure 310 accommodated in the trench structure T, the transistor structure 1000 in the semiconductor body 100 is provided. Some of the features as described in the following may be specific features of an embodiment, in which the semiconductor body 100 is a silicon carbide semiconductor body. However, the transistor structure 1000 and the embodiment as described with regard to FIG. 3A shall not be regarded as restrictive, since some of the features may be provided in a different manner when providing a semiconductor body not being a silicon carbide semiconductor body.

The transistor structure 1000 comprises transistor cells 1100 arranged in an overlapping area between the source contact structure 500 and the semiconductor body 100. For the sake of simplicity, only one transistor cell 1100 is shown. Each of the transistor cells 1100 comprises a gate trench GT extending from the first surface 101 into the semiconductor body 100. The gate trench GT accommodates the gate electrode 320 of the transistor structure 1000. According to the embodiment depicted in FIG. 3A, the dielectric layer 200 further lines a sidewall of the gate trench GT to constitute the gate dielectric of the transistor structure 1000. Due to the different electric characteristic of the gate electrode 320 and the electrostatic discharge protection structure 310, the net dopant concentration of polycrystalline silicon in the gate trench GT may be 10 at least times higher than the net dopant concentration of polycrystalline silicon in the trench structure T. Each of the transistor cells 1100 further comprise the source regions 150 being in contact with the first surface 101 of the semiconductor body 100 and extending into the semiconductor body 100, and body regions 160, in which the source regions 150 are embedded. The source regions 150 are of the first conductivity type and the body regions 160 are of the second conductivity type. Referring to FIG. 3A, the gate trench GT has a tapered form extending into the semiconductor body 100 from the first surface 101. According to an embodiment depicted in a silicon carbide transistor structure 1000, a trench gate structure, for example a tapered trench gate structure is used, since the channel mobility at the planar surface of SiC is too low (in the order of 10 $cm^2/Vs$ compared to silicon having a mobility of about 800 $cm^2/Vs$). The channel mobility in other crystal orientations, e.g. {$0\bar{3}3\bar{8}$} face or along the c-axis (a-plane, 4° off to the surface normal) is significantly higher. Thus, the trench structure may comprise tapered sidewalls having an orientation in a range between 0° to 45°, or between 0° to 20°, or between 0° to 15°, or between 0° to 10°, or between 0° to 5° off to the surface normal of the first surface 101.

Furthermore, a drain region 120 of the first conductivity type is at the second surface 102 of the semiconductor body 100. On the drain region 120, a drain contact structure 110 may be formed, which may be a metallization layer having comparable characteristics and properties as the source contact structure 500 or the gate contact structure 600. A drift region 130 is formed between the drain region 120 and the body regions 160 and is of a first conductivity type. In case of a super-junction device, semiconductor regions of the first conductivity type and of the second conductivity type may be alternatingly arranged along a lateral direction and interposed between the drain region 110 and the body regions 160. The semiconductor regions of the first conductivity type may act as drift regions and the semiconductor regions of the second conductivity type may act as charge compensation regions, for example.

As can be further seen from the embodiment depicted in FIG. 3A, for example in case of having a SiC transistor structure 1000, the trench structure T is surrounded by a well region 140 in the semiconductor body 100. The extension of the well region 140 from the first surface 101 into the semiconductor body 100 is higher than the extension of the trench structure T from the first surface 101 into the semiconductor body 100. The extension of the well region 140 from the first surface 101 into the semiconductor body 100 is further larger than the extension of the gate trench GT and the body regions 160 from the first surface 101 into the semiconductor body 100. The well region 140 may be an implanted well of the second conductivity type. In order to define the potential of the well region 140 to be equal to the source potential, the well region 140 is electrically coupled to the source contact structure 500 via the first electric contact structure 510 and a highly doped well contact region 170, the well contact region 170 being formed at the first surface 101 to extend into the semiconductor body 100 and being in contact with the well region 140. Further, a highly doped body contact region 180 is provided, the body contact region 180 being formed at the first surface 101 to extend into the semiconductor body 100 and being in contact with the body region 160.

The well region 140 may be used for both the transistor cell 1100 and the trench structure T accommodating the electrostatic discharge protection structure 310 for the reduction of the electrical field as a buried shielding of the second conductivity type. Herein, the electrostatic discharge protection structure 310 or the back to back-diode chain or back to back-Zener diode chain may be electrically isolated from the drain potential by both the dielectric isolation of the dielectric layer 200 (optionally constituting a gate oxide having a thickness in a range between 20 nm to 500 nm) and the junction isolation of the vertical pn-junction formed between the drift region 130 and the well region 140. This principle is also applicable for silicon insulated-gate bipolar transistors (IGBIs) or silicon metal oxide semiconductor field effect transistors (MOSFETs) with trench cells which, however, have vertical trenches (90° off the surface normal).

Thus, by providing the well region 140 additionally shielding the electrical field from the boundary surface at which the dielectric layer 200 is provided, the same dielectric layer 200 having a low thickness in the range from 20 in to 200 nm may be formed lining the gate trench GT and the trench structure T, without providing a field dielectric layer in addition for shielding the trench structure T.

Referring to FIG. 3A, the layer structure of the embodiment of the semiconductor device 10 allows for less surface topology compared to polysilicon diodes on top of field oxides having a thickness of 1 μm to 2 μm due to the planar first surface 101 and a lower thermal impedance of the electrostatic discharge protection structure 310 due to the dielectric layer 200 being a thin gate dielectric layer having a thickness in a range between 5 nm to 200 nm, or between 40 nm to 120 nm, or between 60 nm to 100 nm. Thus, a monolithic integration of a polysilicon Zener diode in a silicon carbide MOS process (SiCMOS) configured for operating voltages in a range between 600 V to 3000 V, or in a range between 600 V to 2000 V, or in a range between 600 V to 1500 V with tapered gate trenches filled with polycrystalline silicon may be provided. The Zener diode of the electrostatic discharge protection structure 310 may be integrated in the silicon carbide drift layer of the drift region 130 due to the trench gate concept in combination with a buried p-shielding by means of a deep p-well of the well region 140. To get a sufficient planarization of the Zener diode polycrystalline silicon filled trenches of the electrostatic discharge protection structure 310, the width of each of the Zener diodes may be reduced to 0.5 μm up to 2 μm. Referring to the cross-sectional view of FIG. 3A, a high voltage silicon carbide vertical power MOSFET with a monolithically integrated polysilicon back-to-back Zener diode cascade for gate/source electrostatic discharge (ESD) human body model (HBM) protection is provided.

Furthermore, instead of a discharge protection structure 310, a device or structure 310 may also comprise a single diode to provide a sensing signal, or an integrated polysilicon resistor. The doping concentration of these devices 310 may be in the range between $1\times10^{14}$ cm$^{-3}$ to $1\times10^{20}$ cm$^{-3}$, or between $1\times10^{14}$ cm$^{-3}$ to $1\times10^{18}$ cm$^{-3}$. Especially in the case of lower doping concentrations, an effective electrical shielding is needed to prevent sidewall or backgate effects which can influence a depletion, enhancement or inversion region within the device 310. Therefore, these devices 310 should be electrically shielded against static or ever-changing electric potentials within the ambience of the structure 310 within the semiconductor body 100. This electrical shielding can be provided by the dielectric structure 210 together with the well region 140 (FIG. 3A).

Figure 3B:
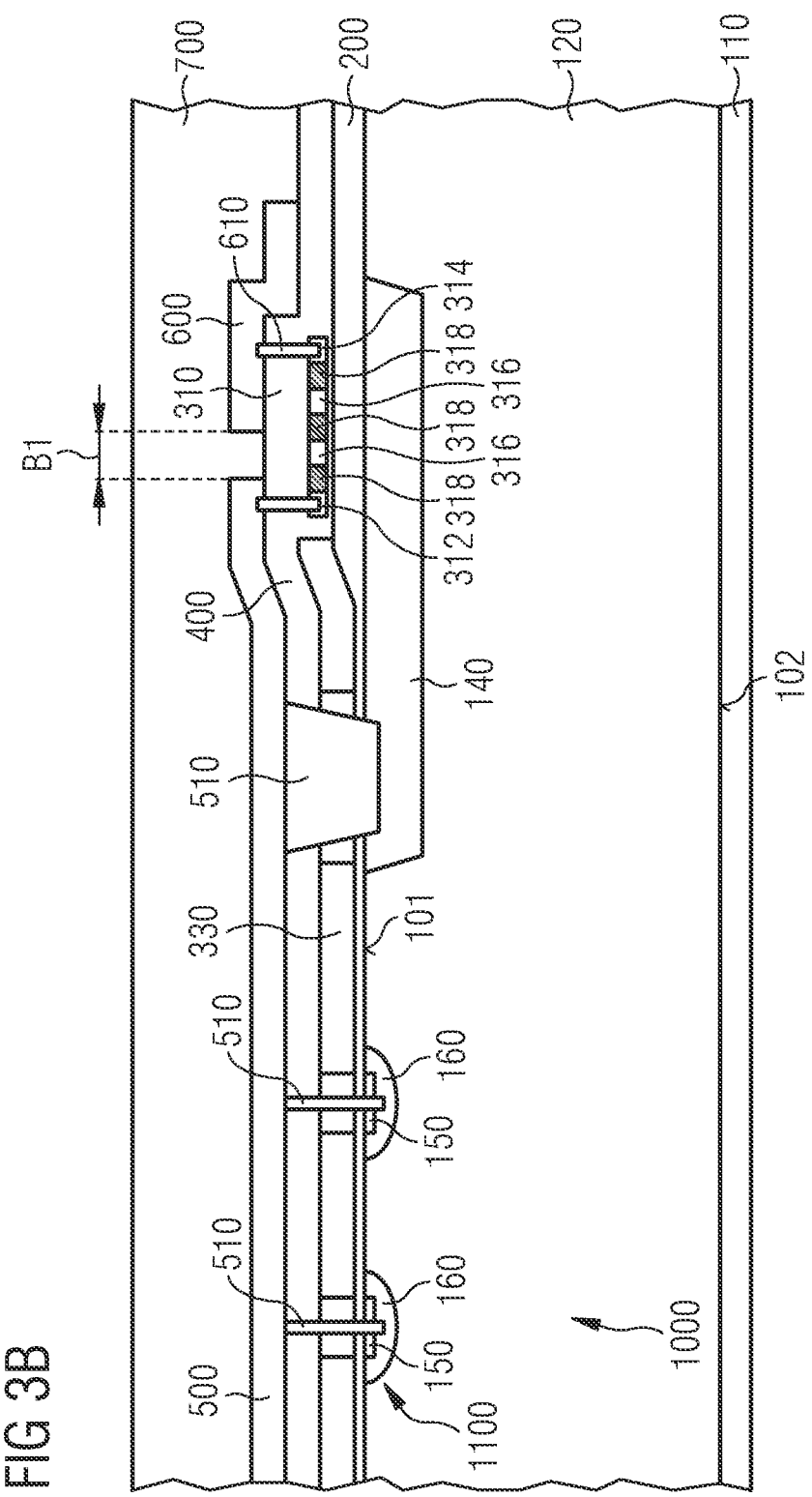
FIG. 3B is a schematic cross-sectional view of a portion of a semiconductor device taken along a section plane C-C' of FIG. 2A in accordance with an embodiment.

FIG. 3B is a schematic cross-sectional view of a portion of a semiconductor device taken along a section plane C-C' of FIG. 2A in accordance with an embodiment.

Figure 4:
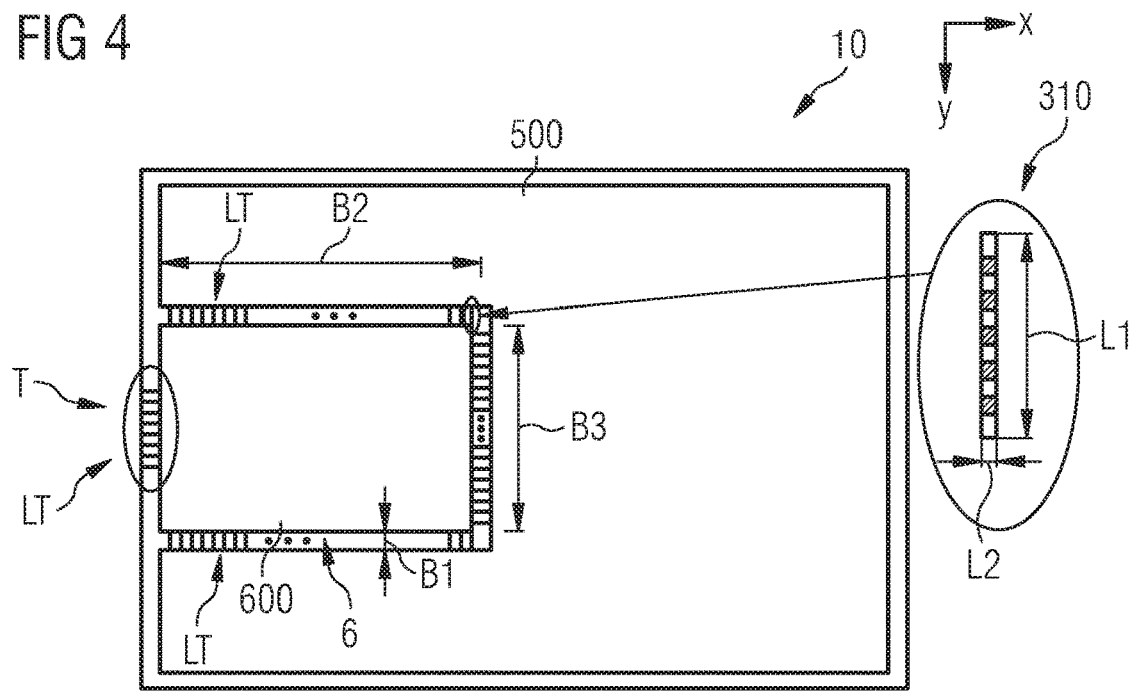
FIG. 4 is a plan view of a portion of a semiconductor device according to an embodiment.
Figure 5:
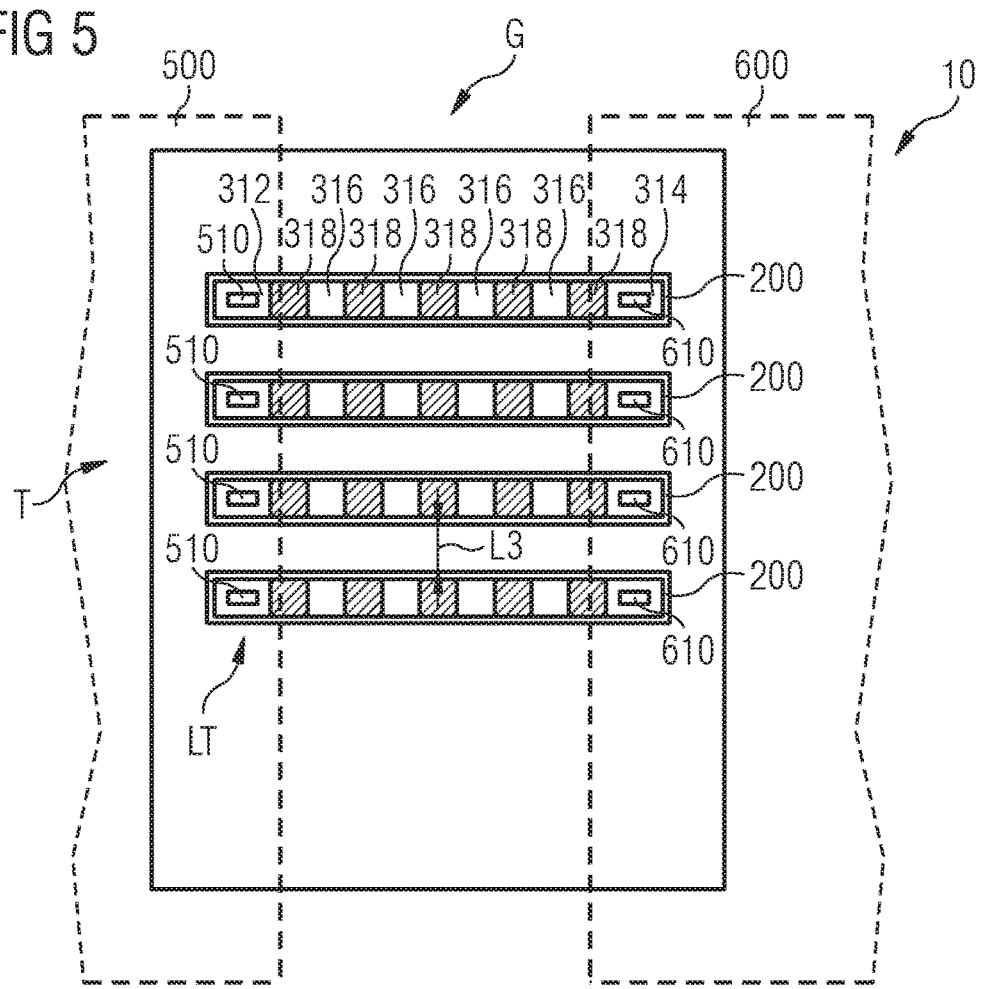
FIG. 5 is a detailed plan view of a portion of a semiconductor device of FIG. 4.

The transistor structure 1000 comprises transistor cells 1100 arranged in an overlapping area between the source contact structure 500 and the silicon carbide semiconductor body 100. Each of the transistor cells 1100 comprise a gate electrode layer 330 formed on the dielectric layer 200 constituting a gate dielectric layer, the source regions 150 being in contact with the first surface 101 of the silicon carbide semiconductor body 100 and extending into the semiconductor body 100, and body regions 160, in which the source regions 150 are embedded. The source regions 150 are of the first conductivity type and the body regions 160 are of the second conductivity type. Furthermore, the drain region 110 of the first conductivity type is arranged at the second surface 102 of the semiconductor body 100. The drift region 120 is formed between the drain region 110 and the body regions 160 at the first surface 101 and is of a first conductivity type. The electrostatic discharge protection structure 310 is formed on the dielectric layer 200, which is formed on the first surface 101 of the silicon carbide semiconductor body 100 as a field oxide layer. Thus, the electrostatic discharge protection structure 310 is not accommodated within the trench structure T, as depicted in FIG. 3A, but formed over the silicon carbide semiconductor body 100. A further electrical shielding may be provided by the well region 140, which has been already described above. FIG. 4 is a plan view of a portion of the semiconductor device 10 according to an embodiment, wherein FIG. 5 is a detailed plan view of a portion of the semiconductor device 10 of FIG. 4. As discussed above, the trench structure T may be filled with polycrystalline silicon, wherein the polycrystalline silicon has a planar top side being flushed with the first surface 101 of the semiconductor body 100. As will be described below with regard to the method of manufacturing the semiconductor device 10, a structure of the electrostatic discharge protection structure 310 being parallel or flush with the first surface 101 may be achieved by using a chemical mechanical polishing-(CMP-)process before depositing the isolation layer 400. In order to avoid bays, depressions or notches due to a too large polishing area of the polycrystalline silicon within the trench structure T, a mesa structure of the trench structure T depicted in FIG. 4 and depicted in more detail in FIG. 5 is provided. Herein, the trench structure T comprises a plurality of longitudinal trenches LT each accommodating a back to back-diode chain.

Referring to FIG. 4 and FIG. 5, the longitudinal trenches LT each bridge the lateral gap G, wherein the source contact structure 500 and the gate contact structure 600 are formed within a same interconnection layer and are spaced from another by the lateral gap G. The lateral G has been described above.

The longitudinal trenches LT may each have a length L1 along a longitudinal direction of the longitudinal trenches LT within a lateral plane in a range between 2 µm to 100 µm, or between 5 µm to 50 µm, or between 10 µm to 30 µm. The longitudinal trenches IT may further each have a width L2 being perpendicular to a longitudinal direction of the longitudinal trenches LT within a lateral plane in a range between 100 nm to 10 µm, or between 200 nm to 5 µm, or between 500 nm to 2 µm. The longitudinal trenches LT may be arranged in parallel within a lateral plane having a mean distance L3 from each other in a range between 100 nm to 10 µm, or between 200 nm to 5 µm, or between 500 nm to 2 µm. The longitudinal trenches LT may be arranged in a regular pattern of longitudinal trenches LT each having the same distance L3 from one another.

The longitudinal trenches LT may each have a length L1 along a longitudinal direction of the longitudinal trenches LT within a lateral plane and may each have a width L2 perpendicular to a longitudinal direction of the longitudinal trenches LT within a lateral plane, wherein the ratio between the length L1 and the width L2 may be in a range between 5 to 100, or between 5 to 50, or between 2 to 50, or between 5 to 20.

The longitudinal trenches LT may be arranged in parallel having a mean distance L3 from each other and each having a width L2 perpendicular to a longitudinal direction of the longitudinal trenches LT within a lateral plane, wherein the ratio between the mean distance L3 and the width L2 may be in a range between 0.1 to 10, or between 0.2 to 5, or between 0.5 to 2. According to an embodiment, the mean distance L3 may be the same as the width L2.

As can be further seen from FIG. 4, the dimension of the gate contact structure 600 in a first lateral direction x may be in a range between 100 µm to 1000 µm, or between 200 µm to 600 µm, or between 300 µm to 400 µm. Furthermore, the dimension B3 of the gate contact structure 600 in a second lateral direction y may be in a range between 100 µm to 1000 µm, or between 200 µm to 600 µm, or between 250 µm to 350 µm. An exemplary length L1 of a longitudinal trench LT may be 20 µm, for example. Taking, for example, a width L2 of a longitudinal trench LT and a mean distance L3 of 1 µm, which leads to a pitch of 2 µm, the total number of back-to-back diode chains accommodated in the longitudinal trenches LT illustrated as lines in FIG. 4 bridging the lateral gap G between the source contact structure 500 and the gate contact structure 600 may be in a range between 300 to 700, or between 400 to 600, or between 450 to 500.

Thus, the total width of the diode chains within the longitudinal trenches LT may be up to 500 µm or up to 700 µm or up to 1000 µm. Thus, with reference to the layout principle of the embodiment depicted in FIG. 4 and FIG. 5, the breakdown voltage of the back-to-back Zener diode cascades may be smaller than the gate oxide (GOX) tunnelling threshold voltage to fulfil gate oxide reliability requirements. To meet electrostatic discharge (ESD) human body model (HBM) protection at the diode breakdown voltage VBS=k*VDB0 (k=number of electrical blocking pn junctions within the Z diode chain, VDB0=electrical breakdown voltage of each blocking pn junction), the ESD diode may have a low differential resistance in the breakdown mode.

Referring to FIG. 5, the longitudinal trenches LT for the polysilicon diodes have cross-sections such as the gate trench GT of the transistor structure 1000 which results in a small width for each diode. In each of the longitudinal trenches LT there is a pn-polydiode chain. The ends of polydiode chains are electrically connected in parallel to ensure a sufficient total cross section area for the electrostatic discharge current. The ends of polysilicon diode chains are connected to gate and source terminals by means of the second terminal region 314 and the first terminal region 312, respectively.

Referring to FIG. 4, according to an example, the longitudinal trenches LT with each 1 µm width, 1 µm spacing and 25 µm length are provided for good planarization. Referring to the plan view of FIG. 4, a monolithically integrated Zener diode matrix with the cumulative width of 500 is µm is provided, which may be sufficient for an electrostatic discharge (ESD)—human body model (HBM) capability of larger than 1 kV. The trench width for the gate trenches GT and the longitudinal trenches LT are set similar. The width L2 is set smaller than 2 times the polycrystalline silicon deposition thickness, thereby allowing longitudinal trenches LT to be filled completely during polycrystalline silicon deposition, and allowing an unmasked polycrystalline silicon etch back may to be used without removing the polycrystalline silicon out of the gate trenches GT.

Although no multilevel metallization is shown, the electrostatic discharge protection structure described above may be also used in discrete or integrated circuits with multilayer metallization systems.

FIG. 6 is a schematic flow diagram for illustrating a method 2000 of manufacturing a semiconductor device.

It will be appreciated that while method 2000 is illustrated and described below as a series of acts or events, the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects of embodiments of the disclosure herein. Also, one or more of the acts depicted herein may be carried out in one or more separate acts and/or phases.

A schematic flow diagram for illustrating a method 2000 of manufacturing a semiconductor device is depicted in FIG. 6.

Process feature S100 comprises forming a transistor structure in a semiconductor body, the semiconductor body having a first surface and a second surface opposite to the first surface.

Process feature S110 comprises forming a trench structure extending from the first surface into the semiconductor body.

Process feature S120 comprises forming an electrostatic discharge protection structure accommodated in the trench structure, the electrostatic discharge protection structure comprising a first terminal and a second terminal.

Process feature S130 comprises forming a source contact structure at the first surface, the source contact structure being electrically connected to source regions of the transistor structure and to the first terminal.

Process feature S140 comprises forming a gate contact structure at the first surface, the gate contact structure being electrically connected to a gate electrode of the transistor structure and to the second terminal.

FIG. 7 is a schematic flow diagram for illustrating a method 3000 of forming the electrostatic discharge protection structure 310.

Process feature S200 comprises applying polycrystalline silicon on the surface of the semiconductor body until the trench structure is filled.

Process feature S210 comprises carrying out a chemical mechanical polishing process in order to remove polycrystalline silicon present above the trench structure.

Process feature S220 comprises forming a back to back-diode chain within the polycrystalline silicon remaining in the trench structure.

A schematic flow diagram for illustrating a method 4000 of forming a transistor structure and forming a trench structure is depicted in FIG. 8.

Process feature S300 comprises simultaneously forming a gate trench and the trench structure extending from the first surface into the semiconductor body.

Process feature S310 comprises applying polycrystalline silicon on the surface of the semiconductor body until the trench structure and the gate trench are filled.

Process feature S320 comprises carrying out a chemical mechanical polishing process in order to remove polycrystalline silicon present above the trench structure and the gate trench, such that the polycrystalline polysilicon in the gate trench and the polycrystalline silicon in the trench structure are separated from one another.

In FIG. 9A to 9I, a method of manufacturing the semiconductor device 10 according to an embodiment will be described with reference to cross-sectional views for illustrating selected processes.

In FIG. 9A, a semiconductor body comprising the drain region 120 and the drift region 130, as described above, is provided.

Referring to FIG. 9B, the well region 140 extending from the first surface 101 into the semiconductor body 100 is formed in the semiconductor body 100. The well region 140 may be formed by a deep p-well implantation with Al ions, wherein the implantation depth of the well region 140 may be between 1 µm and 3 µm. The depth of the p-body zone of the body region 160 may be in a range between 200 nm and 1 µm. The process of forming the body region 160 and the well region 140 may also be performed in a later state of the manufacturing process of the semiconductor device 10.

Referring to FIG. 9C, the trench structure T and the gate trench GT are formed simultaneously in the semiconductor body 100, to extend from the first surface 101 into the semiconductor body 100. The trench structure T and the gate trench GT may extend up to a distance from 0.5 µm to 1 µm into the semiconductor body 100. The trench structure T and the gate trench GT may be formed by an appropriate process, e.g. by dry and/or wet etching. As an example, the trench structure T and the gate trench GT may be formed by an anisotropic plasma etch process, e.g. reactive ion etching (RIE) using an appropriate etch gas, e.g. at least one of $Cl_2$, $Br_2$, $CCl_4$, $CHCl_3$, $CHBr_3$, $BCl_3$, HBr. According to an embodiment, trench sidewalls of the trenches may be tapered. The trench structure T may be formed to comprise tapered sidewalls having an orientation in a range between 0° to 45°, or between 0° to 20°, or between 0° to 15°, or between 0° to 10°, or between 0° to 5° off to the surface normal of the first surface 101. Tapered trench sidewalls may be beneficial with regard to avoiding trench cavities when filling up trenches or with regard to an enhanced channel mobility, for example in a silicon carbide semiconductor body 100.

Referring to FIG. 9D, a dielectric layer 200 such as a silicon oxide layer is formed to line the sidewall of the trench structure T and the gate trench GT as well as the first surface 101 of the semiconductor body 100. The oxide layer of the dielectric layer 200 may be formed by a field oxidation or deposition process or may be formed as a gate oxide layer by a thermal oxidation process. The thickness of the dielectric layer 200 may be in a range between 10 nm to 100 nm, or between 40 nm to 60 nm.

Figure 9E:
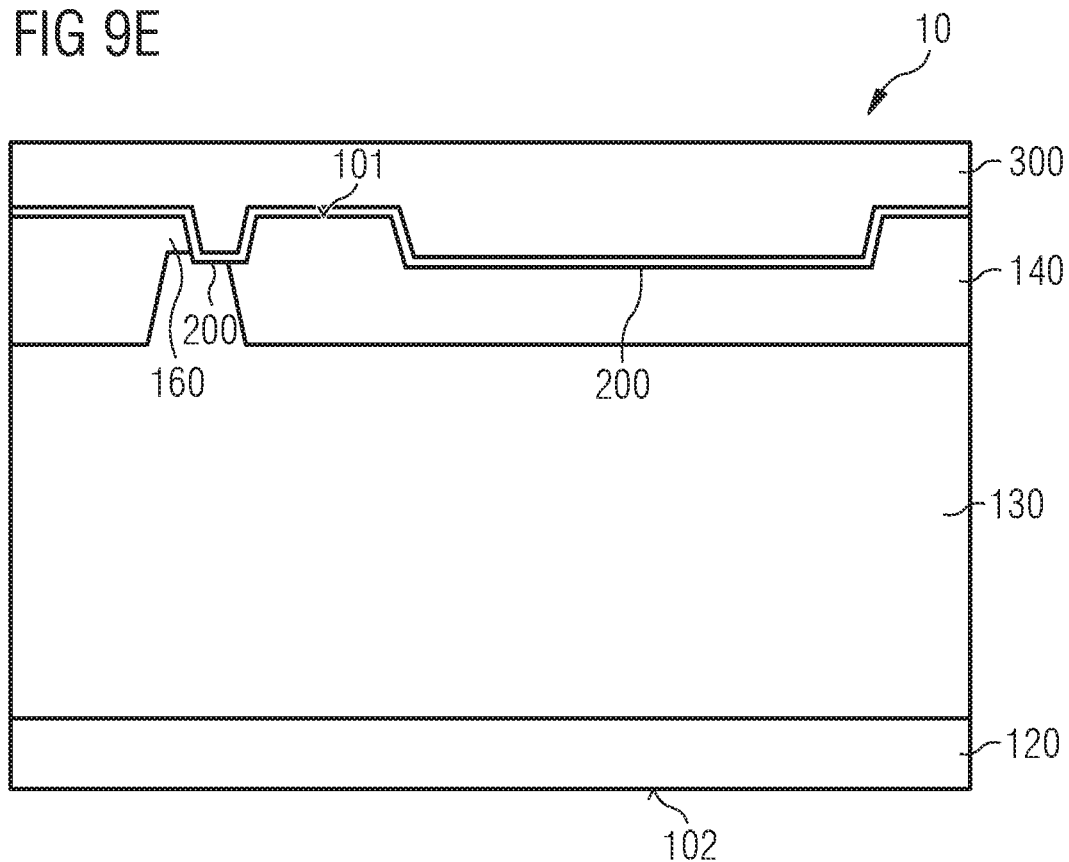

Referring to FIG. 9E, polycrystalline silicon is deposited on the surface of the semiconductor body 100 until the trench structure T and the gate trench GT are filled.

Figure 9F:
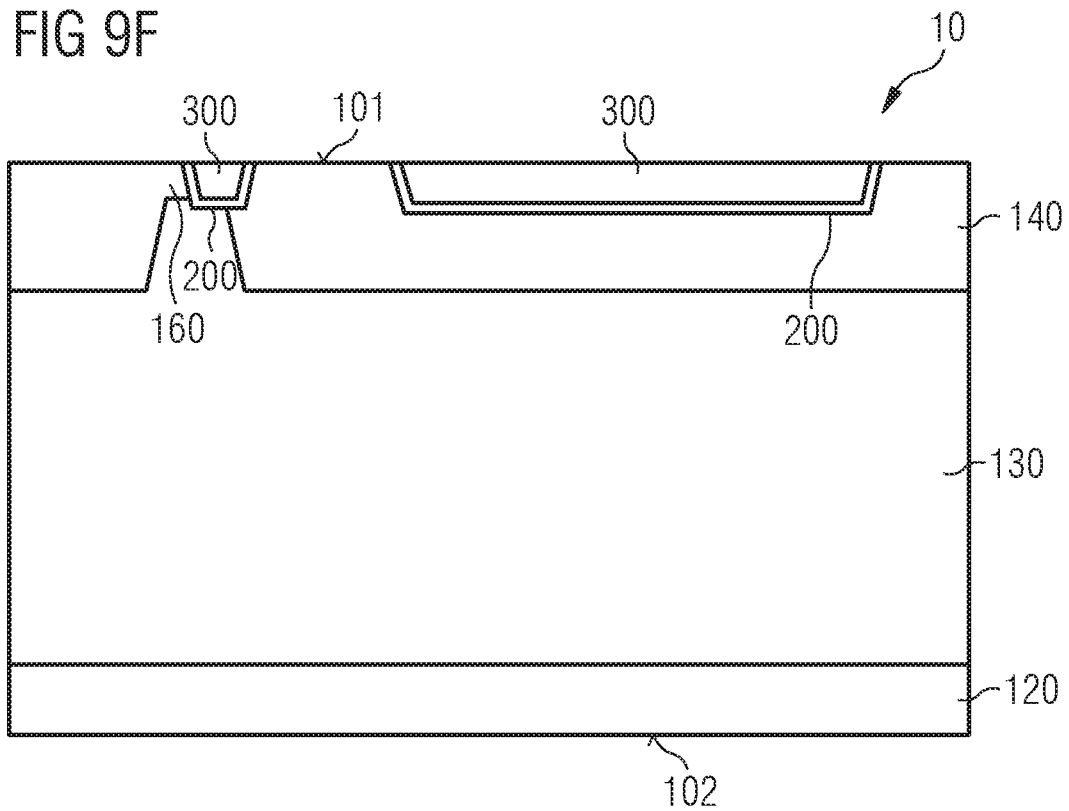

Referring to FIG. 9F, polycrystalline silicon present above the trench structure T and the gate trench. GT is removed such that the polycrystalline silicon in the gate trench GT and the polycrystalline silicon in the trench structure T are separated from one another. Removal of the polycrystalline silicon may be carried out by a chemical mechanical polishing process.

Referring to FIG. 9G, a back to back-diode chain is formed within a polycrystalline silicon layer 300 remaining in the trench structure T. Regarding the processes illustrated in FIG. 9C to FIG. 9G, optional other processes may be performed.

According to a first option, the trench structure T and the gate trench GT may be formed in different etching processes and not simultaneously, as illustrated in FIG. 9C. Furthermore, also the deposition or generation of the dielectric layer 200 and the deposition of the polycrystalline silicon may be performed separately for the transistor structure 1000 and the electrostatic discharge protection structure 310 accommodated in the trench structure T.

According to a second option, the deposition of polycrystalline silicon depicted in FIG. 9E may be performed separately for the gate trench GT and the trench structure T. In case of performing such a separate polysilicon deposition, according to a first step, an in-situ highly doped gate polycrystalline silicon is deposited and in a second step, undoped Zener polycrystalline silicon followed by P and B implantations for the monolithically integrated Zener diode are performed.

According to a third option, only one polycrystalline silicon layer 300 is deposited for both the gate trench GT and the trench structure T. According to this option, an undoped or weakly n-doped polycrystalline silicon layer 300 may be deposited on the surface of the semiconductor body 100 to fill the trench structure T and the gate trench structure GT. Thereafter, P or As ions may be used to dope the undoped or weakly n-doped polycrystalline silicon layer 300 in an ion implantation process. Herein, the dopant concentration in the gate electrode 320 within the gate trench GT may be at least 10 times higher than the net dopant concentration of the n-doped first regions 316 of the back to back-diode chain within the trench structure T.

The net dopant concentration of the polycrystalline silicon layer 300 of the first conductivity type, for example an n-type, may be in a range from $5 \times 10^{16}$ cm$^{-3}$ to $5 \times 10^{19}$ cm$^{-3}$, or in a range from $5 \times 10^{16}$ cm$^{-3}$ to $5 \times 10^{18}$ cm$^{-3}$, or in a range from $1 \times 10^{17}$ cm$^{-3}$ to $1 \times 10^{18}$ cm$^{-3}$. The net dopant concentration of the first conductivity type in the gate electrode 320 within the gate trench GT may be larger than $1 \times 10^{19}$ cm$^{-3}$, or larger than $5 \times 10^{19}$ cm$^{-3}$, or larger than $1 \times 10^{20}$ cm$^{-3}$ or larger than $1 \times 10^{21}$ cm$^{-3}$. The net dopant concentration of the first conductivity type in the polysilicon material in the gate trench GT may be smaller than $5 \times 10^{20}$ cm$^{-3}$. According to an embodiment, the n$^+$-doped polycrystalline silicon material may be doped with phosphorus or arsenic.

The net dopant concentration of the second region 318 of the second conductivity type, for example an p-type, may be in a range from $1 \times 10^{18}$ cm$^{-3}$ to $1 \times 10^{21}$ cm$^{-3}$, or in a range from $1 \times 10^{19}$ cm$^{-3}$ to $1 \times 10^{20}$ cm$^{-3}$.

Referring to FIG. 9H, the source regions 150 and the well contact region 170 as well as the body contact region 180 are formed by implantation through the first surface 101 of the semiconductor body 100.

Figure 9I:
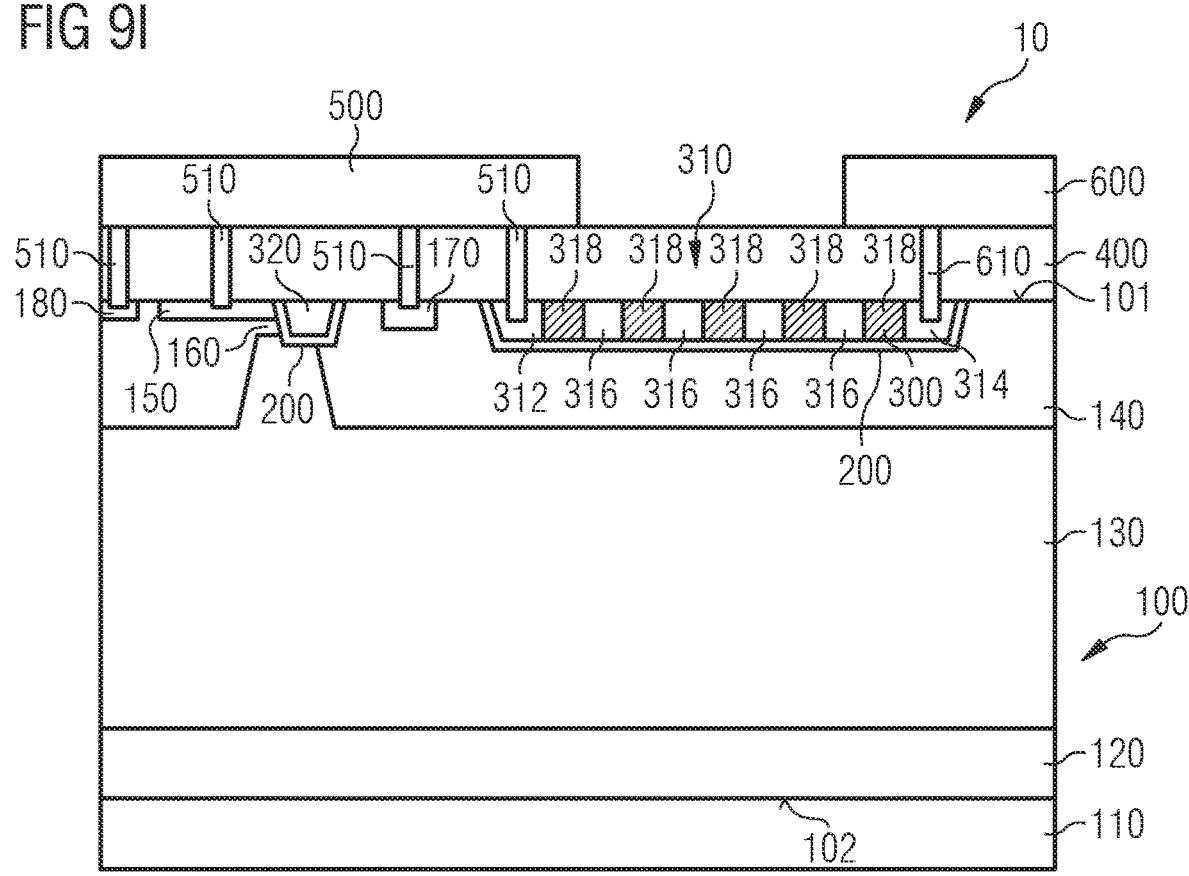

Referring to FIG. 9I, additional processes may be performed such as depositing the isolation layer 400, and forming the gate contact structure 600 and the source contact structure 500. In addition, a drain contact structure 110 may be formed on the backside or on the second surface 102 of the semiconductor body 100.

Referring to FIG. 9J, according to another embodiment, the planar top side of the gate electrode 320 and the electrostatic discharge protection structure 310 may not be flush with the first surface 101 of the semiconductor body 100, but may protrude from the first surface 101 and may be flush with the top surface 101a of the dielectric layer 200, the dielectric layer 200 lining the first surface 101 of the semiconductor body 100. Thus, the electrostatic discharge protection structure 310 may have a planar top side being parallel to the first surface 101. Further, the gate electrode 320 may have a planar top side being parallel with the first surface 101.

For the monolithic integration of electrostatic discharge (ESD) protection elements in superjunction metal oxide semiconductor (MOS) transistors, Trench field effect transistors (FET) or insulated gate bipolar transistors (IGBT), an efficient utilization of the chip area is important. For example, small chips with small capacitances and thin gate oxides may require additional protection elements against ICBM-ESD events.

Chip area increase and additional processing allow for integration of ESD protection elements in power MOS devices. Especially for processes with high wafer costs due to SiC material and maybe together with a plurality of foundation epitaxial layers and a plurality of implantation masks together with transistor masks, the additional chip area for ESD protection elements increase chip costs. Ideally, additional ESD protection elements require no additional chip area and no additional process steps.

For Silicon Carbide (SiC) devices with gate oxide thicknesses of only 50 nm or smaller, the danger of electrostatic destruction or injection may be even higher as compared to Silicon based power technologies. This is caused by a reduced [Rds(on)*Area] of SiC devices because of increased critical electric field strengths. This may result in small chip areas and chip thicknesses with lower ESD capabilities for SiC based power devices.

Using trench gate cells, a full planar surface of the whole chip can be processed, which can simplify etch back or recess process steps for contact filling and planarization. In addition, smaller critical dimension (CD) values for photoresist exposure and development can be achieved easily.

In the above described embodiments, the monolithic integration of Zener protection diodes in Silicon Carbide MOSFETs or IGBTs is provided. The Gate/Source ESD HBM capabilities will be enhanced as compared to power devices without ESD Gate/Source protection. Furthermore, the process topology is planar.

Polycrystalline silicon field plates may be critical in SiC devices since the critical electric field in SiC is in the same order of magnitude as the breakdown field in SiO$_2$. Termination structures in SiC may thus have to be realized as planar junction termination extension (JTE) or variable lateral doping concentration (VLD) regions. When using polycrystalline silicon plates, e. g. for connections metal/polycrystalline silicon, the polycrystalline silicon plates may have to be located above p-doped SiC-areas with an electric potential of 0V for shielding the dielectric below the polycrystalline silicon plate from dangerous electric fields by junction isolation.

According to the embodiments described above, a bidirectional ESD protection device in a Silicon Carbide MOSFET or IGBT is provided.

To meet electrostatic discharge (ESD) human body model (HBM) protection at the diode breakdown voltage VBS=k*VDB0 (k=number of electrical blocking pn-junctions within the Z diode chain, VDB0=electrical breakdown voltage of each blocking pn-junction), the ESD diode should have a low differential resistance in the breakdown mode.

According to the above embodiment, electrically shielded ESD diodes are fabricated by using gate trench processes, the ESD diodes comprising bidirectional ESD protection devices for Silicon Carbide MOSFETs or IGBTs to meet ESD-HBM capability.

Silicon Carbide (SiC) transistors or IGBTs which may show performance comparable or better than state-of-the-art Si superjunction devices are all equipped with trench gates since the channel mobility is higher as compared to the planar surface of SiC.

Using the deep p well implantation of a SiCMOS process (which is used for both transistor cell and edge termination for the reduction of the electrical field) as a p-shield, the Zener diode is electrically isolated from the Drain potential by both the dielectric isolation of the gate oxide (thickness 50 nm) and the junction isolation of the vertical pn-junction. This principle is also applicable for SiC IGBTs or Si MOSFETs with trench cells.

According to the embodiment described above, lateral Si-poly diode chains are realized in trenches cladded with a dielectric insulating material.

Alternatively or in addition, polycrystalline silicon trench gate resistors may be integrated between gate pad and metal gate runner.

In the following, further embodiments of the semiconductor device and/or the method as described herein are explained in detail. It is to be understood that the features mentioned above and those yet to be explained below may be used not only in the respective combinations indicated, but also in other combinations or in isolation without departing from the scope of the invention. In general, the method described herein may be used for manufacturing a semiconductor device as described herein. That is to say, all features disclosed in connection with the method may also be disclosed for the semiconductor device and vice versa.

According to at least one embodiment, the semiconductor device comprises a semiconductor body having a first surface and a second surface opposite to the first surface, a transistor structure in the semiconductor body, a trench structure extending from the first surface into the semiconductor body, and an electrostatic discharge protection structure accommodated in the trench structure, the electrostatic discharge protection structure comprising a first terminal region and a second terminal region. The semiconductor device further may comprise a source contact structure at the first surface, the source contact structure being electrically connected to source regions of the transistor structure and to the first terminal region. The semiconductor device further comprises a gate contact structure at the first surface, the gate contact structure being electrically connected to a gate electrode of the transistor structure and to the second terminal region.

According to at least one embodiment of the semiconductor device, the electrostatic discharge protection structure comprises a polycrystalline silicon layer having first regions and at least one second region of opposite conductivity type alternately arranged to constitute a back to back-diode chain.

According to at least one embodiment of the semiconductor device, the trench structure comprises a plurality of longitudinal trenches each accommodating a back to back-diode chain.

According to at least one embodiment of the semiconductor device, the source contact structure and the gate contact structure are formed within a same interconnection layer and are spaced from one another by a lateral gap, the longitudinal trenches bridging the lateral gap.

According to at least one embodiment of the semiconductor device, the longitudinal trenches each have a length along a longitudinal direction of the longitudinal trenches within a lateral plane and each have a width perpendicular to a longitudinal direction of the longitudinal trenches within a lateral plane, the ratio between the length and the width being in a range between 5 to 50.

According to at least one embodiment of the semiconductor device, the longitudinal trenches are arranged in parallel having a mean distance from each other and each having a width perpendicular to a longitudinal direction of the longitudinal trenches within a lateral plane, the ratio between the mean distance and the width being in a range between 0.1 to 10.

According to at least one embodiment of the semiconductor device, the trench structure is filled with polycrystalline silicon, the polycrystalline silicon having a planar top side being parallel with the first surface of the semiconductor body.

According to at least one embodiment of the semiconductor device, the semiconductor device further comprises a dielectric layer lining a sidewall of the trench structure, in order to electrically insulate the electrostatic discharge protection structure in the trench structure from the semiconductor body.

According to at least one embodiment of the semiconductor device, the semiconductor device further comprises a gate trench extending from the first surface into the semiconductor body, the gate trench accommodating the gate electrode of the transistor structure.

According to at least one embodiment of the semiconductor device, the dielectric layer further linin a sidewall of the gate trench constitutes the gate dielectric of the transistor structure.

According to at least one embodiment of the semiconductor device, the net dopant concentration of polycrystalline silicon in the gate trench is at least ten times higher than the net dopant concentration of polycrystalline silicon in the trench structure.

According to at least one embodiment of the semiconductor device, the semiconductor body is a silicon carbide semiconductor body.

According to at least one embodiment of the semiconductor device, the trench structure is surrounded by a well region in the semiconductor body.

According to at least one embodiment of the semiconductor device, the well region is an implanted well.

According to at least one embodiment of the semiconductor device, the trench structure comprises tapered sidewalls having an orientation in a range between 0° to 45° off to the surface normal of the first surface.

According to at least one embodiment of the semiconductor device, the semiconductor device further comprises an isolation layer on the first surface, the source contact structure being formed on the isolation layer and electrically coupled to the first terminal region of the electrostatic discharge protection structure via a first electric contact structure, and the gate contact structure being formed on the isolation layer and electrically coupled to the second terminal region of the electrostatic discharge protection structure via a second electric contact structure.

According to at least one embodiment of a semiconductor device described herein, the semiconductor device comprises silicon carbide semiconductor body having a first surface and a second surface opposite to the first surface, a transistor structure in the silicon carbide semiconductor body, and an electrostatic discharge protection structure on the silicon carbide semiconductor body, the electrostatic discharge protection structure comprising a first terminal region and a second terminal region. The semiconductor device comprises a source contact structure at the first surface, the source contact structure being electrically connected to source regions of the transistor structure and to the first terminal region and a gate contact structure at the first surface, the gate contact structure being electrically connected to a gate electrode of the transistor structure and to the second terminal region.

According to at least one embodiment of the semiconductor device, the electrostatic discharge protection structure comprises a plurality of first regions and a plurality of second regions of opposite conductivity type alternately arranged to constitute a back-to-back diode chain.

According to at least one embodiment of a method for manufacturing a semiconductor device as described herein, the method comprises the steps of: forming a transistor structure in a semiconductor body, the semiconductor body having a first surface and a second surface opposite to the first surface; forming a trench structure extending from the first surface into the semiconductor body; forming an electrostatic discharge protection structure accommodated in the trench structure, the electrostatic discharge protection structure comprising a first terminal region and a second terminal region; forming a source contact structure at the first surface, the source contact structure being electrically connected to source regions of the transistor structure and to the first terminal region; and forming a gate contact structure at the first surface, the gate contact structure being electrically connected to a gate electrode of the transistor structure and to the second terminal.

According to at least one embodiment of the method, the step of forming the electrostatic discharge protection structure comprises: applying polycrystalline silicon on the surface of the semiconductor body until the trench structure is filled; carrying out a chemical mechanical polishing process or plasma etch processing in order to remove polycrystalline silicon present above the trench structure; and forming a back to back-diode chain within the polycrystalline silicon remaining in the trench structure.

According to at least one embodiment of the method, forming the transistor structure and forming the trench structure comprises: simultaneously forming a gate trench and the trench structure extending from the first surface into the semiconductor body; applying polycrystalline silicon on the surface of the semiconductor body until the trench structure and the gate trench are filled; carrying out a chemical mechanical polishing process in order to remove polycrystalline silicon present above the trench structure and the gate trench, such that the polycrystalline silicon in the gate trench and the polycrystalline silicon in the trench structure are separated from one another.

According to at least one embodiment of the method, applying polycrystalline silicon comprises filling the trench structure with polycrystalline silicon having a first net dopant concentration and filling the gate trenches with polycrystalline silicon having a second net dopant concentration being at least ten times higher than the first net dopant concentration.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a silicon carbide semiconductor body having a first surface and a second surface opposite to the first surface;
   a transistor structure in the silicon carbide semiconductor body;
   a trench structure extending from the first surface into the silicon carbide semiconductor body;
   an electrostatic discharge protection structure in the trench structure and comprising a first terminal region and a second terminal region;
   a source contact structure at the first surface and electrically connected to source regions of the transistor structure and to the first terminal region; and
   a gate contact structure at the first surface and electrically connected to a gate electrode of the transistor structure and to the second terminal region.

2. The semiconductor device of claim 1, wherein the electrostatic discharge protection structure comprises a polycrystalline silicon layer having first regions and at least one second region of opposite conductivity type alternately arranged to form a back-to-back diode chain.

3. The semiconductor device of claim 1, wherein the trench structure comprises a plurality of longitudinal trenches each accommodating a back-to-back diode chain.

4. The semiconductor device of claim 3, wherein the source contact structure and the gate contact structure are formed within a same interconnection layer and are spaced from one another by a lateral gap, the longitudinal trenches bridging the lateral gap.

5. The semiconductor device of claim 3, wherein the longitudinal trenches each have a length along a longitudinal direction of the longitudinal trenches within a lateral plane, and wherein the longitudinal trenches each have a width perpendicular to the longitudinal direction, and wherein a ratio between the length and the width is in a range between 5 to 50.

6. The semiconductor device of claim 3, wherein the longitudinal trenches are arranged in parallel, have a mean distance from each other and each have a width perpendicular to a longitudinal direction of the longitudinal trenches within a lateral plane, and wherein a ratio between the mean distance and the width is in a range between 0.1 to 10.

7. The semiconductor device of claim 1, wherein the trench structure is filled with polycrystalline silicon, and wherein the polycrystalline silicon has a planar top side that is parallel with the first surface of the silicon carbide semiconductor body.

8. The semiconductor device of claim 1, further comprising a dielectric layer lining a sidewall of the trench structure, wherein the dielectric layer electrically insulates the electrostatic discharge protection structure in the trench structure from the silicon carbide semiconductor body.

9. The semiconductor device of claim 8, wherein the dielectric layer forms a gate dielectric of the transistor structure.

10. The semiconductor device of claim 1, further comprising a gate trench extending from the first surface into the silicon carbide semiconductor body, wherein the gate trench accommodates the gate electrode of the transistor structure.

11. The semiconductor device of claim 10, wherein the trench structure and the gate trench each include polycrystalline silicon, and wherein a net dopant concentration of the polycrystalline silicon in the gate trench is at least ten times higher than a net dopant concentration of the polycrystalline silicon in the trench structure.

12. The semiconductor device of claim 1, wherein the trench structure is surrounded by a well region in the silicon carbide semiconductor body.

13. The semiconductor device of claim 12, wherein the well region is an implanted well.

14. The semiconductor device of claim 1, wherein the trench structure comprises tapered sidewalls having an orientation in a range between 0° to 45° off to the surface normal of the first surface.

15. The semiconductor device of claim 1, further comprising an isolation layer on the first surface, wherein the source contact structure is formed on the isolation layer and is electrically coupled to the first terminal region of the electrostatic discharge protection structure via a first electric contact structure, and wherein the gate contact structure is formed on the isolation layer and is electrically coupled to the second terminal region of the electrostatic discharge protection structure via a second electric contact structure.

16. A method for manufacturing a semiconductor device, the method comprising:
forming a transistor structure in a silicon carbide semiconductor body, the silicon carbide semiconductor body having a first surface and a second surface opposite to the first surface;
forming a trench structure extending from the first surface into the silicon carbide semiconductor body;
forming an electrostatic discharge protection structure in the trench structure, the electrostatic discharge protection structure comprising a first terminal region and a second terminal region;
forming a source contact structure at the first surface, the source contact structure being electrically connected to source regions of the transistor structure and to the first terminal region; and
forming a gate contact structure at the first surface, the gate contact structure being electrically connected to a gate electrode of the transistor structure and to the second terminal.

17. The method of claim 16, wherein forming the electrostatic discharge protection structure comprises:
applying polycrystalline silicon on the surface of the silicon carbide semiconductor body until the trench structure is filled;
carrying out a chemical mechanical polishing process or plasma etch processing to remove polycrystalline silicon present above the trench structure; and
forming a back-to-back diode chain within the polycrystalline silicon remaining in the trench structure.

18. The method of claim 16, wherein forming the transistor structure and forming the trench structure comprises:
simultaneously forming a gate trench and the trench structure extending from the first surface into the silicon carbide semiconductor body;
applying polycrystalline silicon on the surface of the silicon carbide semiconductor body until the trench structure and the gate trench are filled; and
carrying out a chemical mechanical polishing process to remove polycrystalline silicon present above the trench structure and the gate trench, such that the polycrystalline silicon in the gate trench and the polycrystalline silicon in the trench structure are separated from one another.

19. The method of claim 18, wherein applying the polycrystalline silicon comprises:
filling the trench structure with polycrystalline silicon having a first net dopant concentration; and
filling the gate trenches with polycrystalline silicon having a second net dopant concentration being at least ten times higher than the first net dopant concentration.

20. A semiconductor device, comprising:
a silicon carbide semiconductor body having a first surface and a second surface opposite to the first surface;
a transistor structure in the silicon carbide semiconductor body;
a trench structure extending from the first surface into the silicon carbide semiconductor body;
a first electrostatic discharge protection structure in the trench structure and comprising a first terminal region and a second terminal region;
a second electrostatic discharge protection structure on the silicon carbide semiconductor body and comprising a first terminal region and a second terminal region;
a source contact structure at the first surface and electrically connected to source regions of the transistor structure and to the first terminal region of the first and the second electrostatic discharge protection structures; and
a gate contact structure at the first surface and electrically connected to a gate electrode of the transistor structure and to the second terminal region of the first and the second electrostatic discharge protection structures.

* * * * *